US012720885B2

(12) United States Patent
Chen et al.

(10) Patent No.: US 12,720,885 B2
(45) Date of Patent: Aug. 25, 2026

(54) IMAGE SENSOR AND METHOD OF MANUFACTURING THE SAME

(71) Applicant: Taiwan Semiconductor Manufacturing Company, Ltd., Hsinchu (TW)

(72) Inventors: Szu-Ying Chen, Miaoli County (TW); Yu-Min Liao, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 586 days.

(21) Appl. No.: 18/149,721

(22) Filed: Jan. 4, 2023

(65) Prior Publication Data

US 2024/0079423 A1 Mar. 7, 2024

Related U.S. Application Data

(60) Provisional application No. 63/404,259, filed on Sep. 7, 2022.

(51) Int. Cl.
*H10F 39/00* (2025.01)
*H10F 39/18* (2025.01)

(52) U.S. Cl.
CPC ..... *H10F 39/80373* (2025.01); *H10F 39/014* (2025.01); *H10F 39/182* (2025.01); *H10F 39/807* (2025.01); *H10F 39/811* (2025.01)

(58) Field of Classification Search
CPC ............. H10F 39/80373; H10F 39/014; H10F 39/182; H10F 39/807; H10F 39/811; H10F 39/8037; H10F 39/80377; H10F 39/12–199; H10F 39/18–1898; H10F 39/806–8067; H01L 21/304; H01L 21/3046; H01L 21/02013; H01L 21/02021
See application file for complete search history.

(56) References Cited

U.S. PATENT DOCUMENTS

| | | | |
|---|---|---|---|
| 9,160,949 | B2 | 10/2015 | Zhang et al. |
| 10,629,765 | B2 | 4/2020 | Wei et al. |
| 10,636,930 | B2 | 4/2020 | Yamashita |
| 2012/0199882 | A1 | 8/2012 | Shin |

(Continued)

FOREIGN PATENT DOCUMENTS

| | | | | |
|---|---|---|---|---|
| JP | 2020113749 A | * | 7/2020 | ............ H10F 39/811 |
| KR | 20150091714 A | * | 8/2015 | ........... H01L 23/481 |

*Primary Examiner* — Shahed Ahmed

(74) *Attorney, Agent, or Firm* — Eschweiler & Potashnik, LLC

(57) ABSTRACT

A CIS has a monolithic transfer gate electrode embedded in the semiconductor substrate. In some embodiments, the transfer gate electrode is below the surface. In some embodiments, the top of the transfer gate electrode is nearly even with or below a bottom of a floating diffusion region. In some embodiments, the transfer gate electrode wraps partially around the area of the floating diffusion region. In some embodiments, the transfer gate electrode wraps entirely around the area of the floating diffusion region. Embedding the transfer gate in the substrate reduces surface crowding and allows a scale reduction. The wrapping of the transfer gate electrode around the area of the floating diffusion region increases the area of the transfer gate channel while limiting the area that is occupied by the transfer gate.

20 Claims, 25 Drawing Sheets

(56) References Cited

U.S. PATENT DOCUMENTS

2017/0062501 A1 3/2017 Velichko et al.
2019/0237499 A1 8/2019 Roy
2020/0066780 A1 2/2020 Roy et al.
2021/0091127 A1 3/2021 Tsao et al.
2021/0159257 A1 5/2021 Moussy et al.
2021/0193703 A1 6/2021 Watanabe et al.
2022/0208817 A1* 6/2022 Kim .................... H10F 39/182
2023/0081238 A1* 3/2023 Jang ...................... H01L 24/09
257/213

* cited by examiner

IMAGE SENSOR AND METHOD OF MANUFACTURING THE SAME

REFERENCE TO RELATED APPLICATION

This application claims the benefit of U.S. Provisional Application No. 63/404,259, filed on Sep. 7, 2022, the contents of which are hereby incorporated by reference in their entirety.

BACKGROUND

Integrated circuits (ICs) with image sensors are used in a wide range of modern-day electronic devices such as cameras and cell phones. Complementary metal-oxide semiconductor (CMOS) devices have become popular IC image sensors. Compared to charge-coupled devices (CCD), CMOS image sensors (CIS) are increasingly favored due to low power consumption, small size, fast data processing, a direct output of data, and low manufacturing cost. As part of drive to reduce IC device sizes, there has been a long felt need to make CIS pixels smaller. As CIS pixels are made smaller, it becomes challenging to solve packaging issues, maintain sensitivity, and limit cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
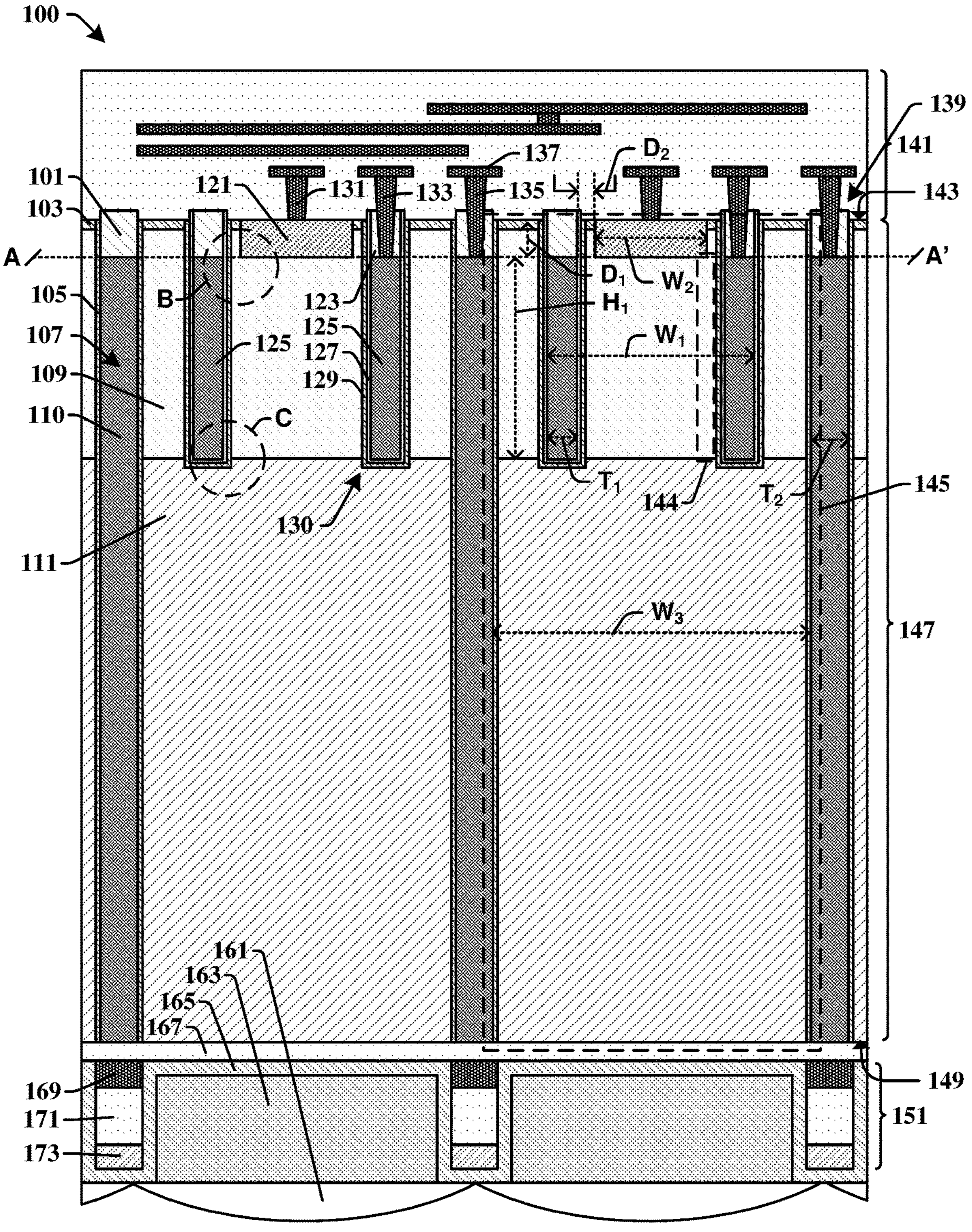
FIG. 1 illustrates a cross-sectional side view on an IC device with a photodetector pixel array according to some embodiments of the present disclosure.

The following disclosure provides many different embodiments, or examples, for implementing different features of the subject matter. Specific examples of components and arrangements are described to simplify the disclosure. These are, of course, merely examples and are not limiting. For example, the formation of a first feature over or on a second feature in the description that follows may include embodiments in which the first and second features are formed in direct contact and may also include embodiments in which additional features are formed between the first and second features so that that the first and second features are not in direct contact. In addition, the present disclosure may repeat reference numerals and/or letters in various examples. This repetition is for the purpose of simplicity and clarity and does not in itself dictate a relationship between the various embodiments and/or configurations exemplified.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some image sensors include a semiconductor substrate with an array of photodetector pixels that include photodiodes. The photodiodes are separated from one another by an isolation structure within the semiconductor substrate. In some cases, the isolation structure has a conductive core. A suitable bias voltage applied to the conductive core reduces cross-talk between adjacent photodetector pixels. In some cases, the isolation structure is formed in the back side of the substrate and the conductive core is coupled to a voltage source through the back side. As the pitch of the grid becomes finer, it becomes progressively more difficult to align an isolation structure formed in the back side with the photodiodes and related structures that are formed in the front side. The isolation structure may be formed and coupled through the front side to facilitate alignment.

The front side isolation structure, and especially vias that couple to the front side isolation structure, contribute to crowding of structures on the front side. Additional structures that are on the front side typically include a transfer gate electrode and a via that couples with a floating diffusion region. The crowding of these structures tends to limit the potential for reducing pixel sizes.

One aspect of the present disclosure is an integrated circuit device with a photodetector structure that reduces crowding on the front side by embedding the transfer gate electrode in the semiconductor substrate. In some embodiments, the transfer gate electrode is confined below the front side surface of the semiconductor substrate. In some embodiments, the transfer gate electrode is spaced a distance below the front side surface. In some embodiments, a top of the transfer gate electrode is at or below the bottom of a floating diffusion region that is formed in the semiconductor substrate. In some embodiments, a top of the transfer gate electrode is below the floating diffusion region. Moving the transfer gate electrode lower into the substrate reduces surface crowding. In some embodiments, the transfer gate has a vertical channel. In some embodiments, the transfer gate electrode is a monolithic structure. A monolithic structure is the type of structure formed by a damascene process. It has substantially vertical sidewalls.

In some embodiments, the transfer gate electrode wraps around partially or entirely around the area of the floating diffusion region. In some embodiments, the transfer gate electrode wraps entirely around the area of the floating diffusion region. In some embodiments, the transfer gate is curved with a concave side facing the area of the floating diffusion region. In some embodiments, the transfer gate electrode clamps two opposite sides of the floating diffusion region area. These structures increase the area of the vertical channel which improves gate control while limiting the area that is occupied by the transfer gate.

A transfer gate according to the present disclosure makes room for vias on the front side. Some of these vias couple with floating diffusion regions. In some embodiments, there is one via that couples to a floating diffusion region for each photodetector pixel. In some embodiments, a via that couple to the floating diffusion region is shared by a plurality of adjacent photodetector pixels. In some embodiments, this sharing occurs through a contact that spans across the floating diffusion regions for each of the photodetector pixels. In some embodiments, this sharing occurs through a floating diffusion region that is shared by the photodetector pixels.

In some embodiments, there are vias on the front side that connect with the isolation structure. In some embodiments, there is at least one of these vias for every four photodetector pixels. In some embodiments, there is at least one of for each photodetector pixel. Having a high concentration of these vias improves regulation of the bias voltage on the isolation structure.

Some aspects of the present teaching relate to a manufacturing method in which formation of the isolation structure is integrated with formation of the transfer gates. In a method according to the present disclosure, trenches for the isolation structure and an opening for the transfer gate are formed so as to be present in the semiconductor substrate at the same time. In some embodiments, the trenches are deepened as the openings are etched. In some embodiments, ions are implanted to line the trenches with a P-doped layer. This P-doped layer may provide electrical isolation for the isolation structure. In some embodiments, this same P-doped layer lines the openings for the transfer gate. The openings are subsequently lines with a transfer gate dielectric and filled with conductive material to provide the transfer gate electrode. As a result, the P-doped layer that lines the isolation structure may be found where in the transfer gate channel immediately adjacent the transfer gate dielectric.

In some embodiments, the trenches are filled with conductive material as the openings are filled with conductive material. In some embodiments, the conductive material found in the isolations structures is the same conductive material that makes up the transfer gate electrode. In some embodiments, an etch is carried out to recess the transfer gate electrode below the front side. In some embodiments, this same etch recesses the conductive core of the isolation structure below the front side. In some embodiments, the voids created by the recessing process are filled to make dielectric plugs. These dielectric plugs may be monolithic. In some embodiments, a hard mask is removed after these dielectric plugs are formed leaving these dielectric plugs protruding above the front side.

FIG. 1 illustrates a cross-sectional view of an IC device 100 that includes a semiconductor substrate 147 in which there is an array 139 of photodetector pixels 145 according to the present disclosure. Two photodetector pixels 145 are illustrated. The photodetector pixels 145 are isolated by a voltage-biased deep trench isolation (DTI) structure 107. Each photodetector pixel 145 includes an N-doped region 111 and a P-doped region 109 that together form a PN diode in the semiconductor substrate 147. A transfer gate 130 modulates transfer of photon-induced charges from the N-doped region 111 to the floating diffusion region 121. The transfer gate 130 includes a transfer gate electrode 125, a transfer gate dielectric 127, and a channel 144 that is provided by the P-doped region 109.

Figure 2A:
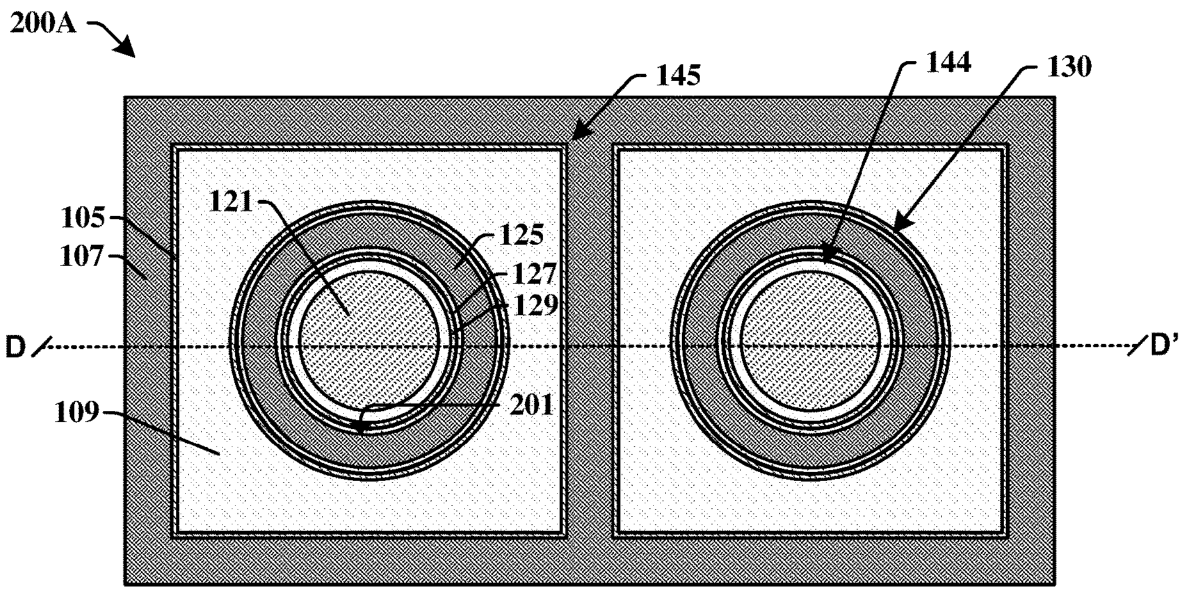
FIG. 2A-2B illustrates plan views according to two embodiments that may correspond with FIG. 1.

FIG. 2A is a plan view 200A that may correspond to the IC device 100 of FIG. 1. The line A-A' of FIG. 1 corresponds with FIG. 2A and the line D-D' of FIG. 2 corresponds with FIG. 1. As shown by the plan view 200A, the transfer gate 130 is curved such that two distinct areas of the transfer gate electrode 125 appear in the cross-sectional view of FIG. 1. These two distinct areas of the transfer gate electrode 125 clamp the area of the floating diffusion region 121. A concave side 201 of the transfer gate electrode 125 faces the area of the floating diffusion region 121. In the plan view 200A, the transfer gate electrode 125 wraps entirely around the area of the floating diffusion region 121. The curvature or wrapping of the transfer gate electrode 125 increases the area of the channel 144.

Figure 2B:
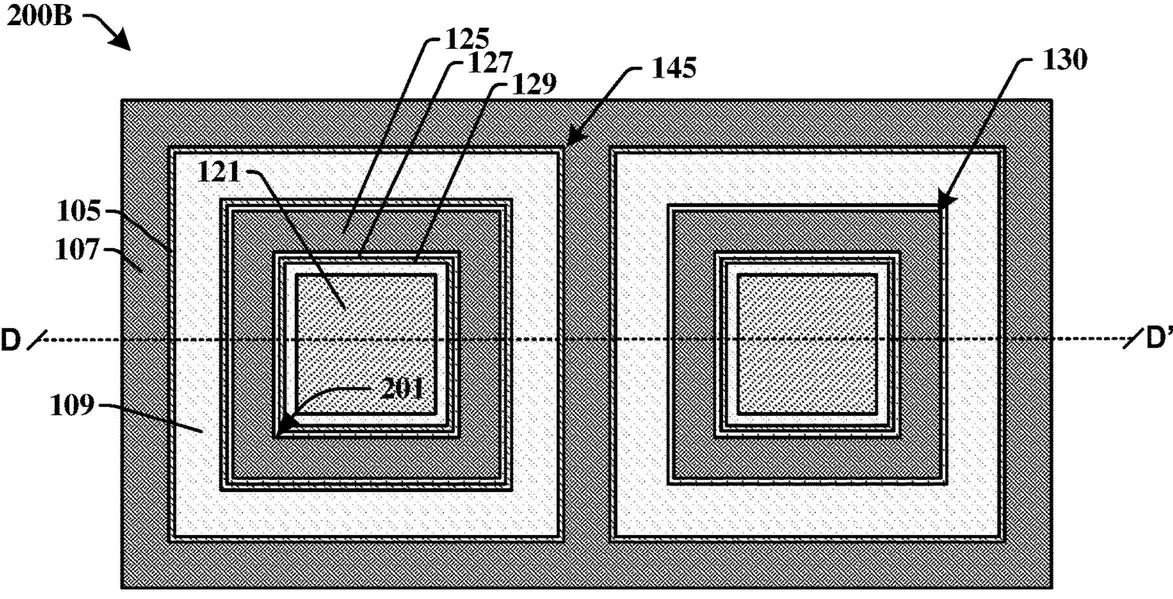

FIG. 2B is another plan view 200B that may also correspond to the IC device 100 of FIG. 1. As shown by the plan view 200B, the transfer gate electrode 125 may be square sided. In this example also the transfer gate electrode 125 wraps entirely around the area of the floating diffusion region 121. In the plan view 200B, the transfer gate electrode 125 may be considered curved with a concave side facing the area of the floating diffusion region 121. In particular, inner corners are curved sides that face the area of the floating diffusion region 121. The area referred to is a chip area.

Returning to FIG. 1, the transfer gate electrode 125 is recessed a distance $D_1$ below a surface (front side) 143 of the semiconductor substrate 147. In some embodiments, the distance $D_1$ is from about 100 nm to about 2000 nm. In some embodiments, the distance $D_1$ is from about 400 nm to about 900 nm. Recessing the transfer gate electrode 125 below the front side 143 reduces leakage between the transfer gate electrode 125 and the floating diffusion region 121. A volume within the semiconductor substrate 147 and directly above the transfer gate electrode 125 is filled by a dielectric plug 123. In some embodiments, the dielectric plug 123 extends slightly above the front side 143.

The transfer gate electrode 125 is a monolithic structure having substantially vertical sidewalls. A monolithic structure is the type of structure that results from filling an opening created by plasma etching through a mask. Any slope of the sidewalls is an artifact of the etch process. The vertical sidewalls relate to the transfer gate 130 having a substantially vertical channel 144. Charges transferring from the N-doped region 111 to the floating diffusion region 121 move in a substantially vertical direction. The photodetector pixels 145 having a vertically stacked structure such that a top of the floating diffusion region 121 is above a top of the transfer gate electrode 125 which is above a top of the N-doped region 111.

In some embodiments, the transfer gate electrode 125 has a height $H_1$ that is greater than its width $W_1$. In some embodiments, the height $H_1$ is two or more times greater than the width $W_1$. Having the height $H_1$ greater than the width $W_1$ facilitates providing the transfer gate 130 with a desired channel length while remaining within a small area.

The transfer gate width $W_1$ is constrained primarily by the pixel width $W_3$. In some embodiments, the pixel width $W_3$ is in the range from about 0.1 μm to about 2 μm. In some embodiments, the pixel width $W_3$ is in the range from about 0.3 μm to about 1 μm. In some embodiments, the transfer gate width $W_1$ is from about 25% to about 90% the pixel width $W_3$. In some embodiments, the transfer gate width $W_1$ is at least about half the pixel width $W_3$.

In some embodiment, a thickness $T_1$ of the transfer gate electrode 125 is in the range from about 30 nm to about 200 nm. In some embodiment, the thickness $T_1$ is in the range from about 100 nm to about 160 nm. If the thickness $T_1$ is too small, the transfer gate electrode 125 may not function properly. If the thickness $T_1$ is too great, the area of the channel 144 may be undesirably reduced and there may not be enough room for the floating diffusion region 121.

In some embodiments, the floating diffusion region 121 has a width $W_2$ in the range from about 50 nm to about 250 nm. In some embodiments, the width $W_2$ is in the range from about 80 nm to about 170 nm. The floating diffusion region 121 is spaced apart from the transfer gate electrode 125 by distance $D_2$. In some embodiments, the distance $D_2$ is in the range from about 5 nm to about 30 nm. In some embodiments, the distance $D_2$ is in the range from about 10 nm to about 15 nm. If the floating diffusion region 121 is too far from the transfer gate electrode 125, the transfer gate 130 may not function as intended. If the floating diffusion region 121 is too close to the transfer gate electrode 125, leakage between the floating diffusion region 121 and the transfer gate electrode 125 may be excessive.

An isolation structure 107 provides electrical isolation and limits cross-talk between adjacent photodetector pixels 145. The isolation structure 107 may be a front side isolation structure, a back side isolation structure, or a combination of front side and back side isolation structures. Electrical isolation may be provided by dielectrics or by semiconductor doping. In the illustrated example, the P-doped layer 105 electrically isolates the conductive core 110 from the N-doped region 111. Additional isolation may be provided by an electric field that results from a bias voltage applied to the conductive core 110. In some embodiments, the bias voltage is a negative voltage. In some embodiments, the bias voltage is from about −0.01V to about −5V.

In the illustrated example, the isolation structure 107 includes a conductive core 110 that is coupled by a via 135 to a wire 137 in an M1 metallization layer within a metal interconnect 141 that is disposed on the front side 143 of the semiconductor substrate 147. In some embodiments, the isolation structure 107 includes oxide or some other suitable dielectric material in addition to the conductive core 110 or as an alternative to the conductive core 110. In some embodiments, a thickness $T_2$ of the conductive core 110 is the range from about 50 nm to about 300 nm. In some embodiments, the thickness $T_2$ is the range from about 100 nm to about 200 nm.

The conductive core 110 may have the same composition as the transfer gate electrode 125. A P-doped layer 129 adjacent the transfer gate dielectric 127 may have a similar thickness and dopant concentration to the P-doped layer 105 adjacent the conductive core 110. The P-doped layer 129 has little or no effect on the operation of the transfer gate 130. The conductive core 110 is recessed below the front side 143 by approximately the same distance $D_1$ as is the transfer gate electrode 125. The within the semiconductor substrate 147 and directly above the conductive core 110 may be filled by a dielectric plug 101 that has the same composition and thickness as the dielectric plug 123 over the transfer gate electrode 125. A heavily P-doped surface layer 103 may be disposed adjacent the front side 143 to improve electrical isolation.

The photodetector pixels 145 form a CMOS image sensor with back side illumination. Micro-lenses 161 on the back side 149 may direct light through color filters 163 and into the photodetector pixels 145. A composite grid 151 including a back side metal grid 169 may assist in directing light into and separating light among the photodetector pixels 145.

Figures 3A, 3B, 3C:
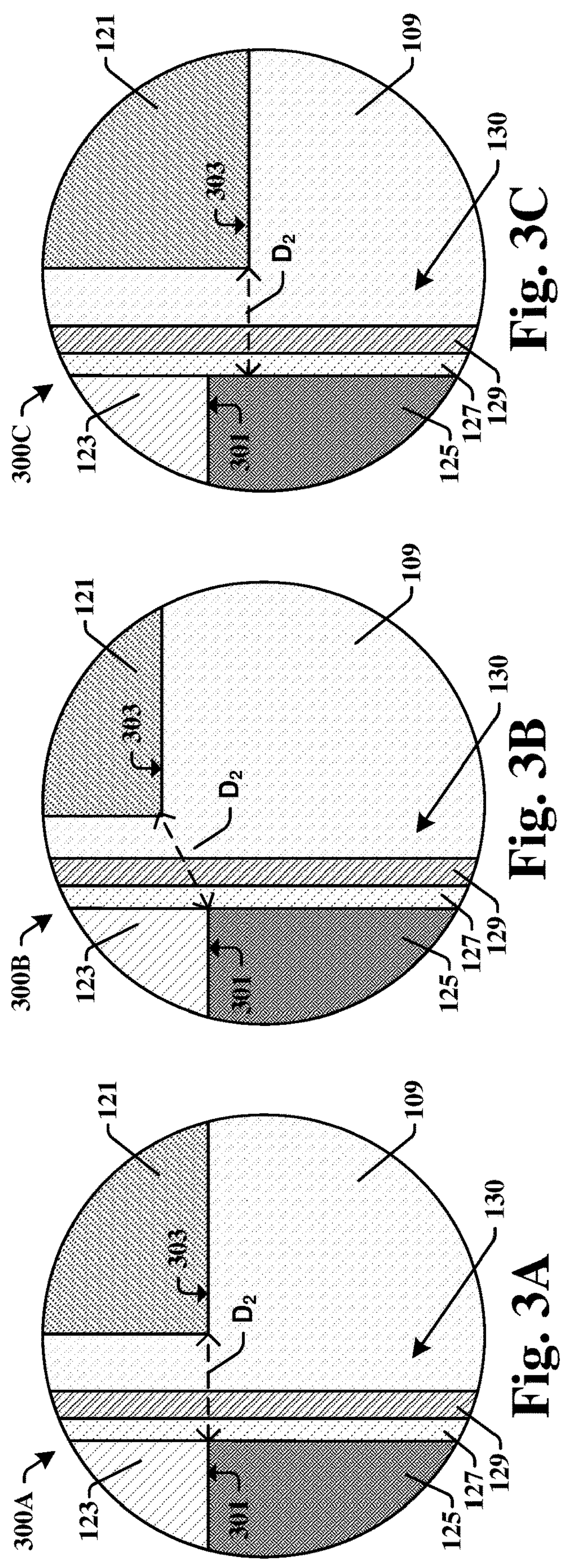
FIG. 3A provides an expanded view of the region B in FIG. 1.
FIG. 3B-3C show two alternate embodiments with views corresponding to FIG. 3A.

FIG. 3A provides an expanded view 300A of the area B identified in FIG. 1. As shown by this expanded view, a bottom 303 of the floating diffusion region 121 is vertically aligned with a top 301 of the transfer gate electrode 125. In this configuration, the floating diffusion region 121 is in a good position to act as a drain for the transfer gate 130 while leakage between the floating diffusion region 121 and the transfer gate electrode 125 is kept minimal.

FIG. 3B provides an expanded view 300B illustrating an alternate embodiment where the bottom 303 of the floating diffusion region 121 is displaced above the top 301 of the transfer gate electrode 125. This configuration allows the floating diffusion region 121 to be made wider while maintain the distance $D_2$ between the transfer gate electrode 125 and the floating diffusion region 121.

FIG. 3C provides an expanded view 300C illustrating an alternate embodiment where the bottom 303 of the floating diffusion region 121 is below the top 301 of the transfer gate electrode 125. This configuration is easier to manufacture than that of the expanded view 300A of FIG. 3A in that the distance $D_2$ is controlled by the lateral displacement between the transfer gate electrode 125 and the floating diffusion region 121 and is not affected by small variations in the depth of the floating diffusion region 121.

Figure 4C:
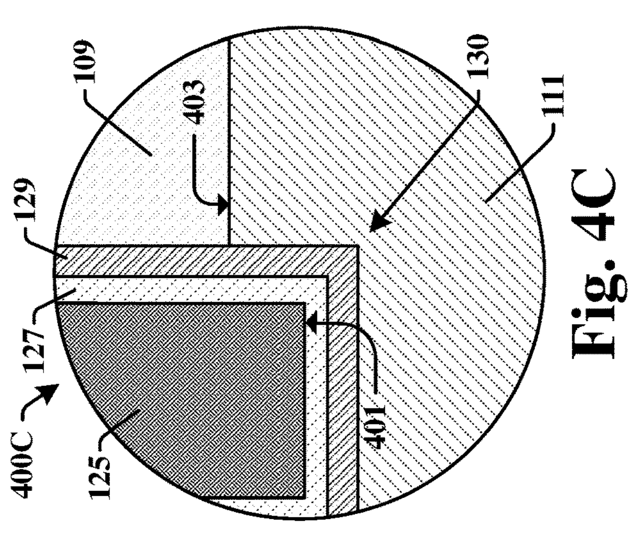
FIG. 4B-4C show two alternate embodiments with views corresponding to FIG. 4A.
Figure 4B:
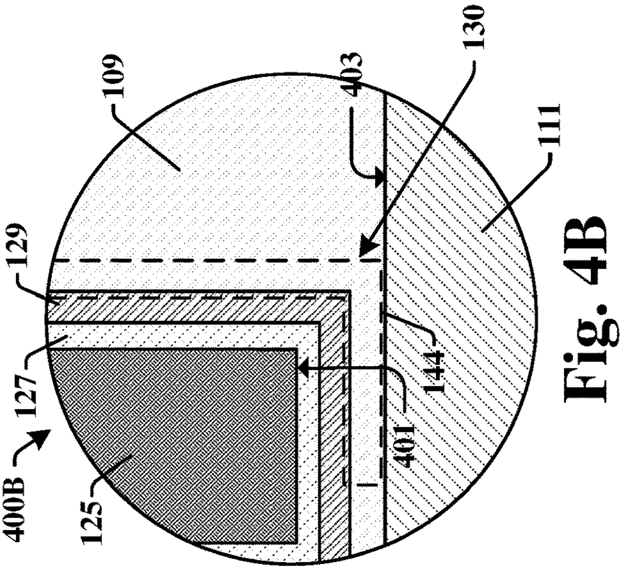
Figure 4A:
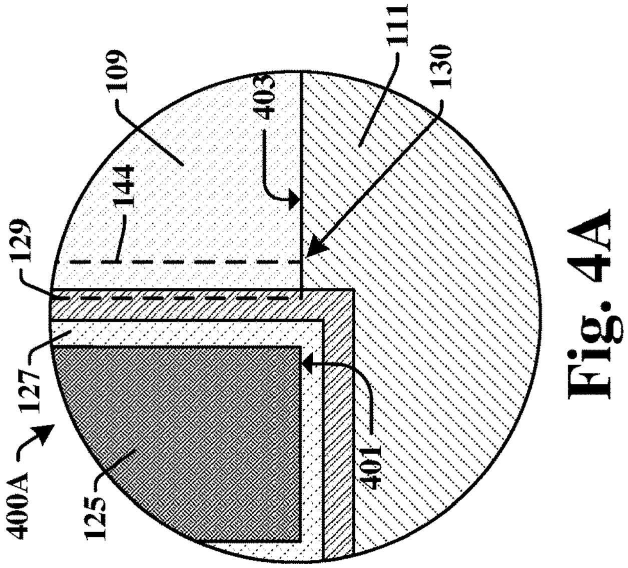
FIG. 4A provides an expanded view of the region C in FIG. 1.

FIG. 4A provides an expanded view 400A of the area C identified in FIG. 1. As shown by this expanded view, a top 403 of the N-doped region 111 is vertically aligned with a bottom 401 of the transfer gate electrode 125. In this configuration, the N-doped region 111 is in a good position to act as a source for the transfer gate 130 while leakage between the N-doped region 111 and the transfer gate electrode 125 is kept minimal.

FIG. 4B provides an expanded view 400B illustrating an alternate embodiment where the top 403 of the N-doped region 111 is below the bottom 401 of the transfer gate electrode 125. In this configuration, the length of the channel 144 may be effectively increased without increasing the size of the transfer gate electrode 125.

FIG. 4C provides an expanded view 400C illustrating an alternate embodiment where the top 403 of the N-doped region 111 is above the bottom 401 of the transfer gate electrode 125. This configuration is easier to manufacture than that of the expanded view 400A of FIG. 4A in that good communication between the transfer gate 130 and the N-doped region 111 is maintained without precisely aligning the top 403 of the N-doped region 111 and the bottom 401 of the transfer gate electrode 125.

Figure 5A:
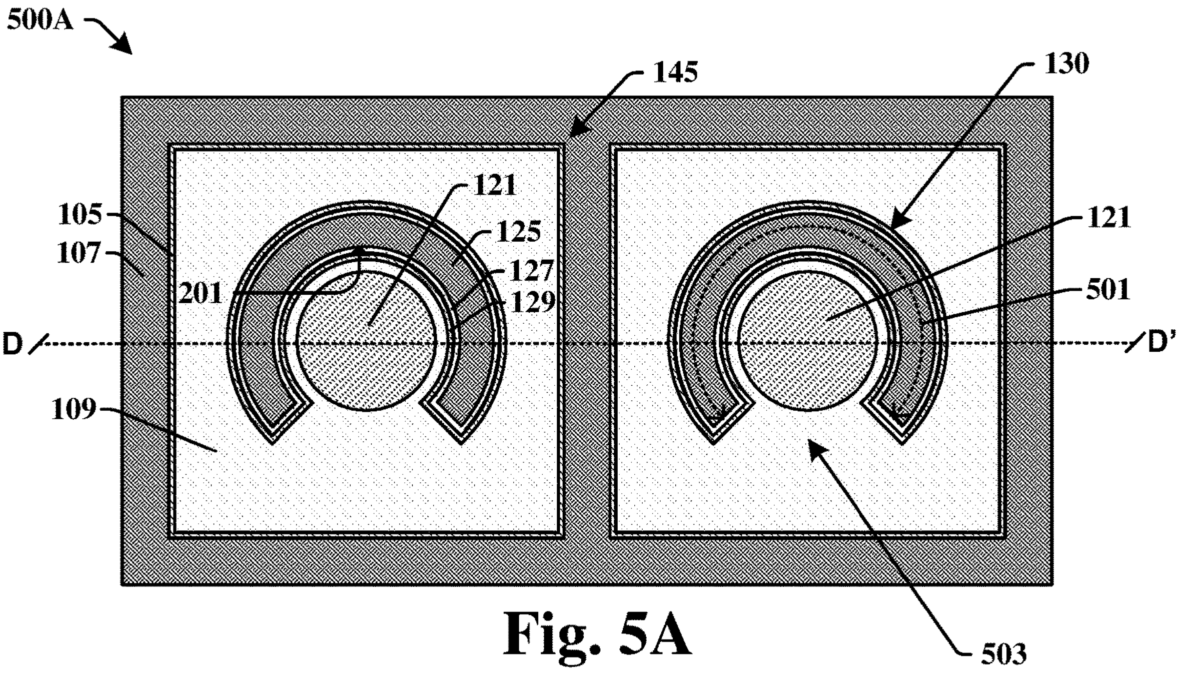
FIG. 5A-5B illustrates two plan views according to two more embodiments that may correspond with FIG. 1.

FIG. 5A is another plan view 500A that may correspond to the IC device 100 of FIG. 1. The plan view 500A is like the plan view 200A of FIG. 2A except that in the plan view 500A the transfer gate 130 does not completely surround the area of the floating diffusion region 121. In the plan view 500A, the transfer gate electrode 125 covers an arc 501 around the area of the floating diffusion region 121. The arc 501 is less than 360 degrees, which leaves an opening 503. In some embodiments, the arc 501 is greater than 180 degrees. In some embodiments, the arc 501 is 270 degrees or more. In general, the greater the arc, the greater the gate control and the lower the threshold voltage of the transfer gate 130.

Figure 5B:
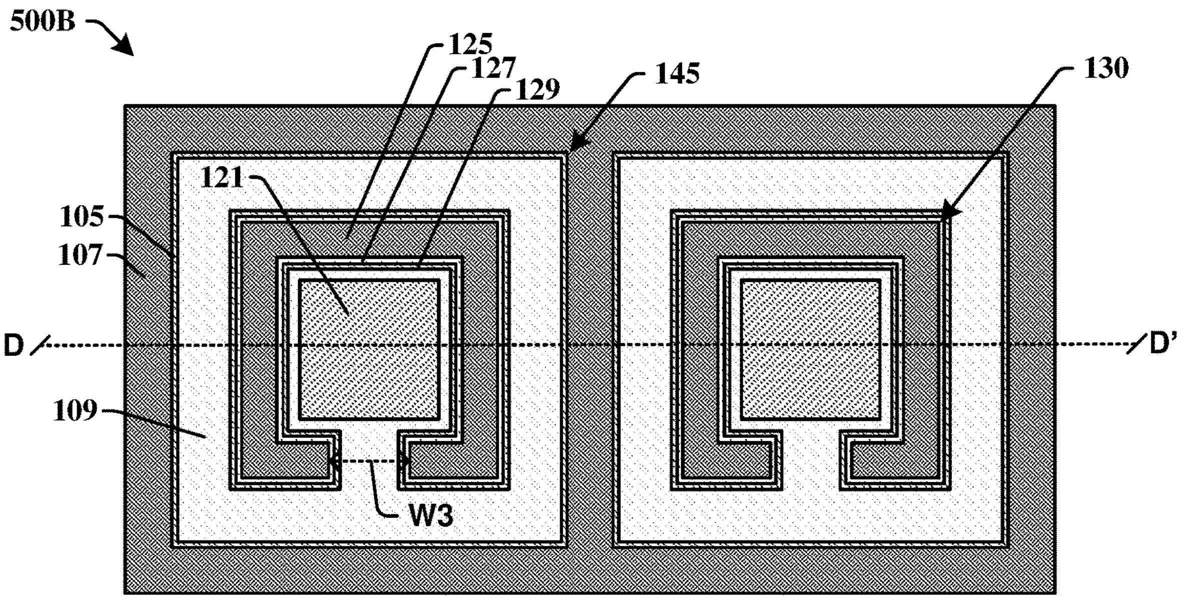

FIG. 5B is a plan view 500B that is like the plan view 500A in that the transfer gate 130 does not completely surround the area of the floating diffusion region 121. The plan view 500B differs from the plan view 500A in that it illustrates the same concept with a square-sided transfer gate electrode 125. The transfer gate electrode 125 has a gap of width $W_3$. In some embodiments, the width $W_3$ is from about 30 nm to about 200 nm. In some embodiments, the width $W_3$ is from about 50 nm to about 80 nm. Keeping the width $W_3$ small increases the functional area of the transfer gate 130.

Figure 6B:
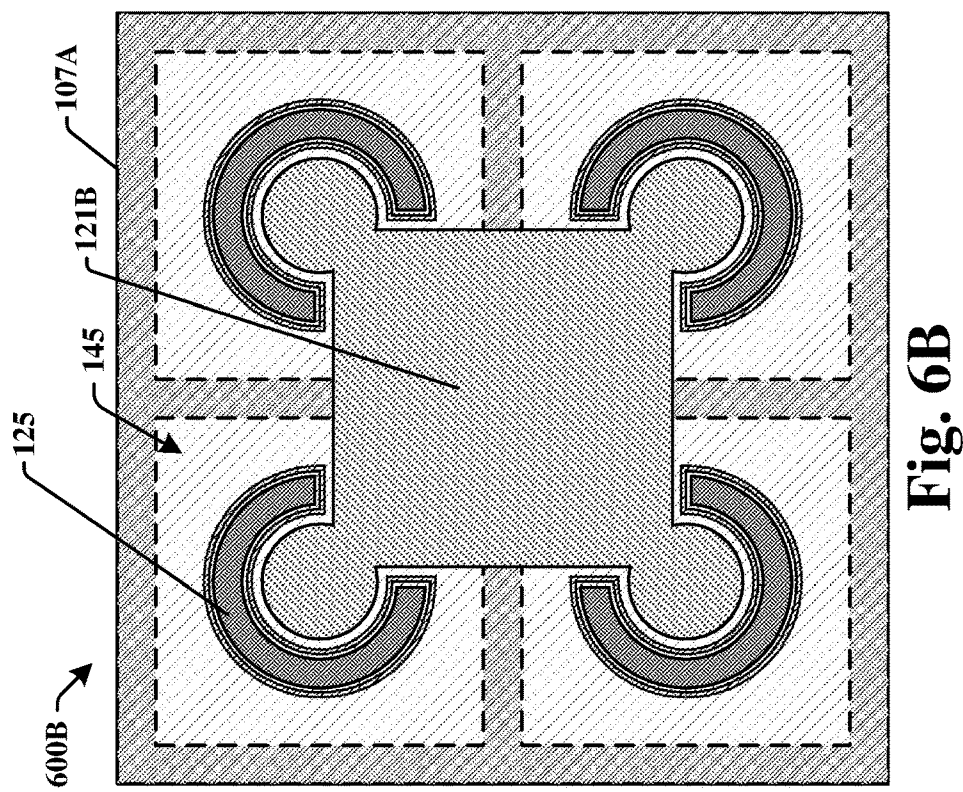
FIG. 6B illustrates an IC device with a photodetector pixel array in which a floating diffusion region is shared by several photodetector pixels in accordance with some embodiments of the present disclosure.
Figure 6A:
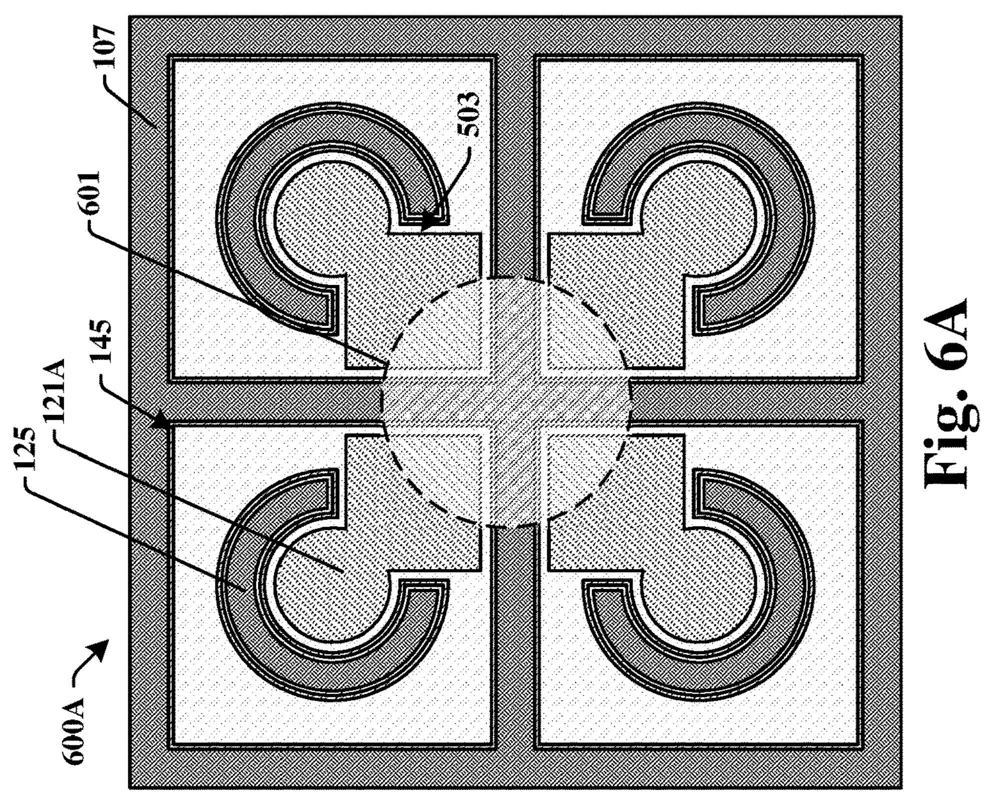
FIG. 6A illustrates an IC device with a photodetector pixel array in which floating diffusion regions share a contact in accordance with some embodiments of the present disclosure.

FIG. 6A illustrates a plan view 600A of an alternate embodiment in which the floating diffusion region 121A of four photodetector pixels 145 are effectively united by a contact 601 that is above the front side 143 (see FIG. 1) of the semiconductor substrate 147. Openings 503 in the transfer gate electrodes 125 as illustrated by the plan view 500A of FIG. 5A allows the floating diffusion regions 121A to extend beyond the perimeters of the corresponding transfer gate electrodes 125. This configuration combines the capacities of multiple floating diffusion regions 121A and reduces the number of vias 131 (see FIG. 1) used for making connections with the floating diffusion region 121A.

FIG. 6B illustrates a plan view 600B of an alternate embodiment in which a single floating diffusion region 121B is shared by four photodetector pixels 145. This embodiment may be implemented with an isolation structure 107A that is below the front side 143 (see FIG. 1) of the semiconductor substrate 147. For example, the isolation structure 107A may be a back side isolation structure. Openings 503 in the transfer gate electrodes 125 as illustrated by the plan view 500A of FIG. 5A allow the floating diffusion region 121B to be united within the semiconductor substrate 147.

FIGS. 7 through 24 provide cross-sectional views 700-2400 which illustrate a method according to some embodiments of forming an IC device with an array of photodetector pixels according to the present disclosure. While FIGS. 7 through 24 are described with reference to various embodiments of a method, it will be appreciated that the structures shown in FIGS. 7 through 24 are not limited to the method but rather may stand alone separate from the method. FIGS. 7 through 24 are described as a series of acts. The order of these acts may be altered in other embodiments. While FIGS. 7 through 24 illustrate and describe a specific set of acts, some may be omitted in other embodiments. Further, acts that are not illustrated and/or described may be included in other embodiments. While the method of FIGS. 7 through 24 illustrates the formation of the IC device 100 of FIG. 1, the method may be used to form other IC devices.

Figure 7:
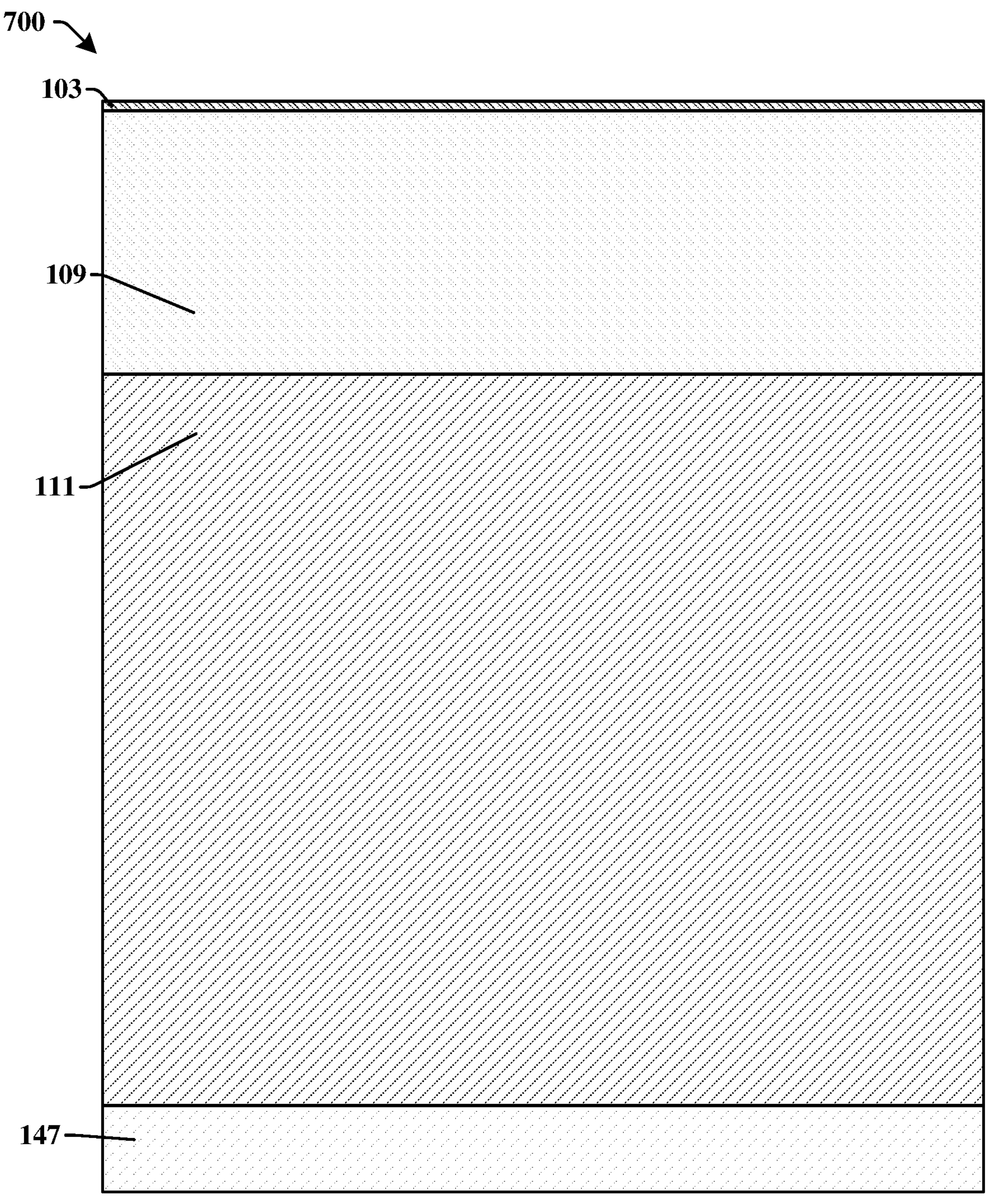
FIGS. 7-24 are a series of cross-sectional view illustrations exemplifying a method according to some embodiments of forming an IC device having a photodetector pixel array with an isolation structure according to the present disclosure.

The method may begin with several blanket implants of the semiconductor substrate 147 shown by the cross-sectional view 700 of FIG. 7. These blanket implants produce the N-doped region 111, the P-doped region 109, and the heavily P-doped surface layer 103. The N-doped region 111 itself may be formed by a plurality of implants at various concentrations and energy levels in order to produce a desired doping profile for the resulting PN diode. In some embodiments, the N-doped region 111 has doping concentrations in the range from about $10^{13}/cm^3$ to about $10^{18}/cm^3$. In some embodiments, the P-doped region 109 has doping concentrations in the range from about $10^{15}/cm^3$ to about $10^{19}/cm^3$. In some embodiments, the heavily P-doped surface layer 103 has a doping concentration of at least about $10^{20}/cm^3$.

The semiconductor substrate 147 may be, for example, a silicon substrate. The semiconductor substrate 147 may also be another suitable semiconductor material or a semiconductor on an insulator or other support. Other semiconductor materials that may be suitable include elemental semiconductors such as diamond or germanium; semiconductor compounds such as gallium arsenide, silicon carbide, indium arsenide, or indium phosphide; and alloy semiconductors such as silicon germanium carbide, gallium arsenic phosphide, or gallium indium phosphide.

Figure 8:
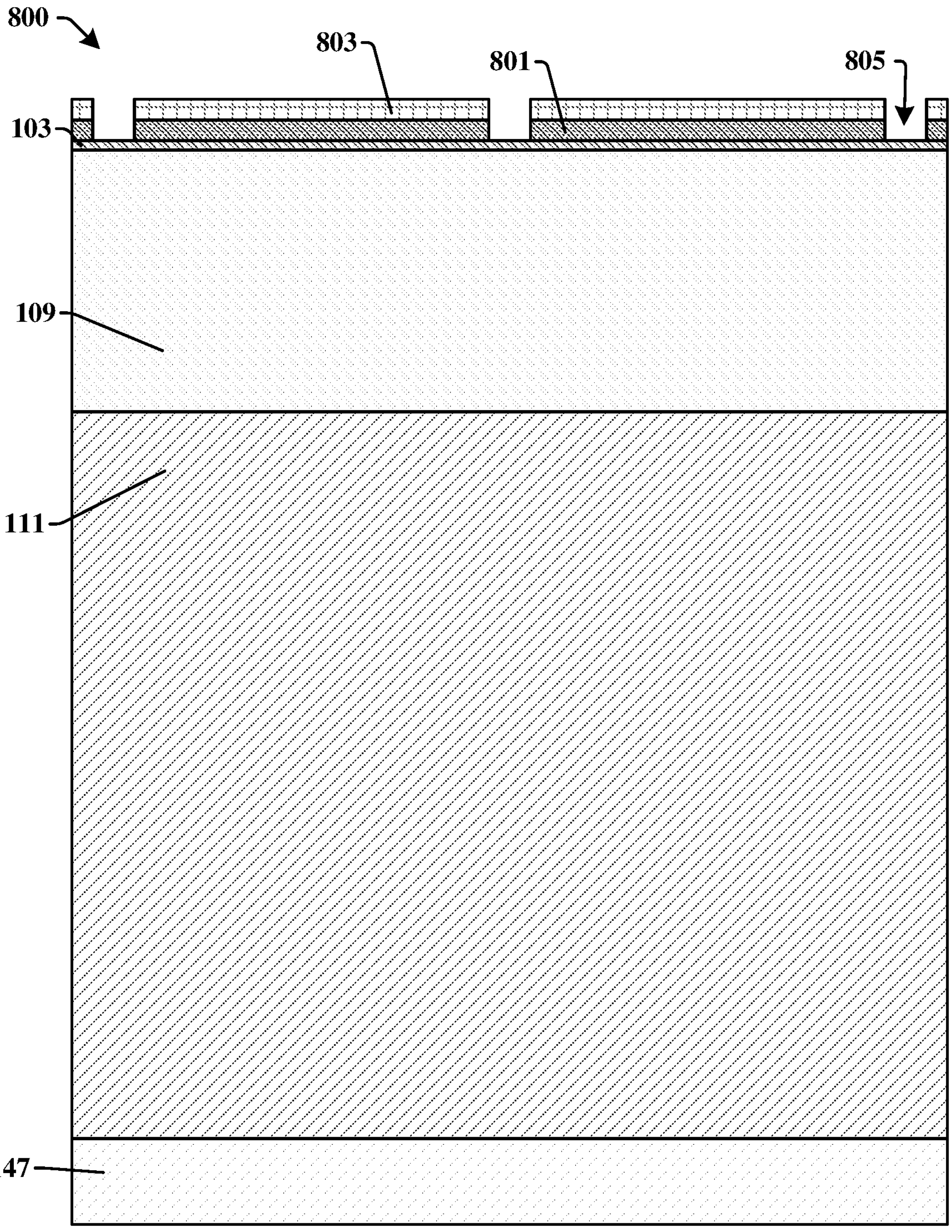

As shown by cross-sectional view 800 of FIG. 8, the method may continue with forming and patterning a hard mask 801. Patterning forms opening 805 in the hard mask 801. The patterning process may include photolithography with the photoresist 803. After patterning, the photoresist 803 may be stripped. The hard mask 801 may be silicon nitride (SiN), silicon carbide (SiC), silicon oxynitride (SiON), silicon oxycarbide (SiOC), the like, or any other suitable hard mask material.

Figure 9:
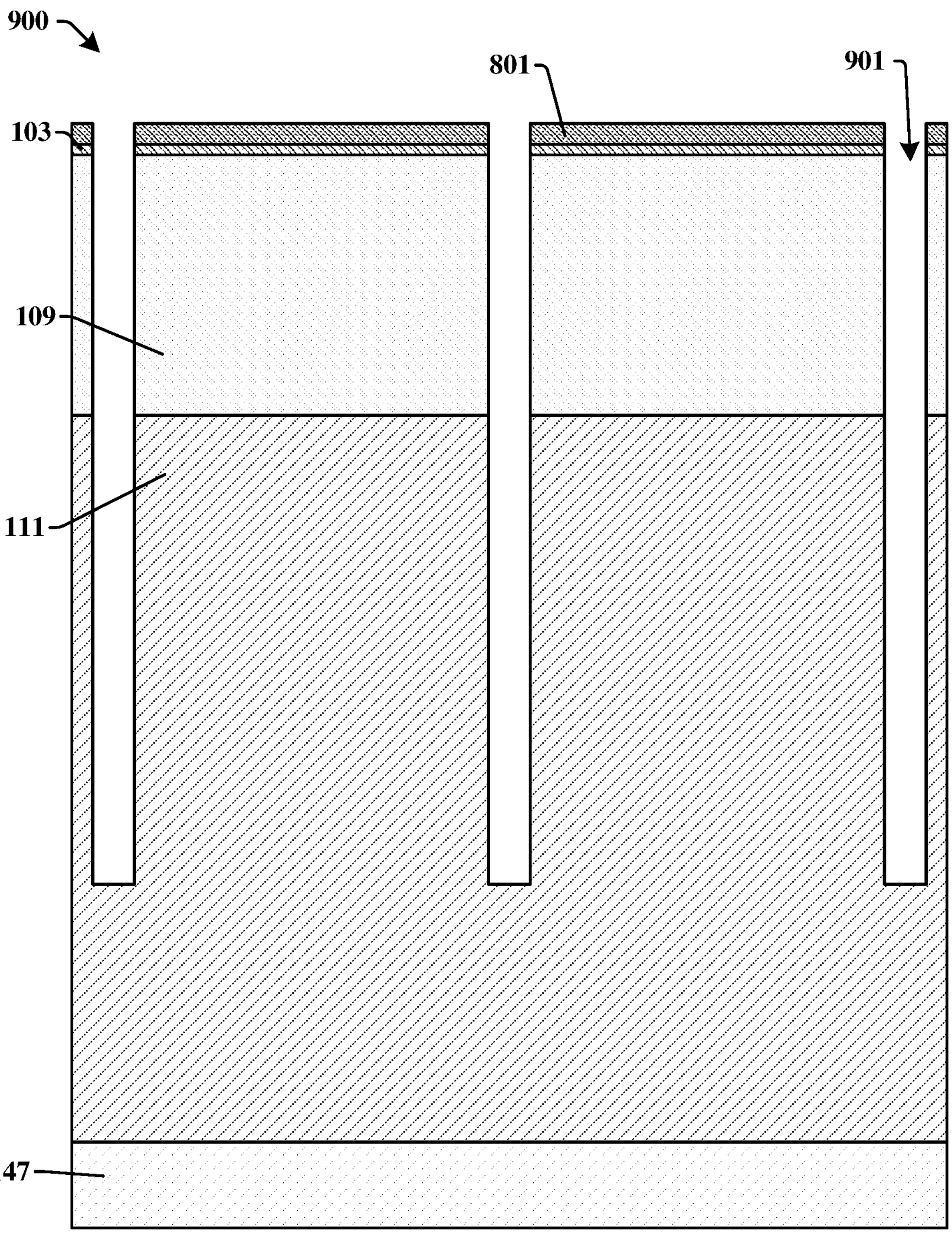
Figure 10:
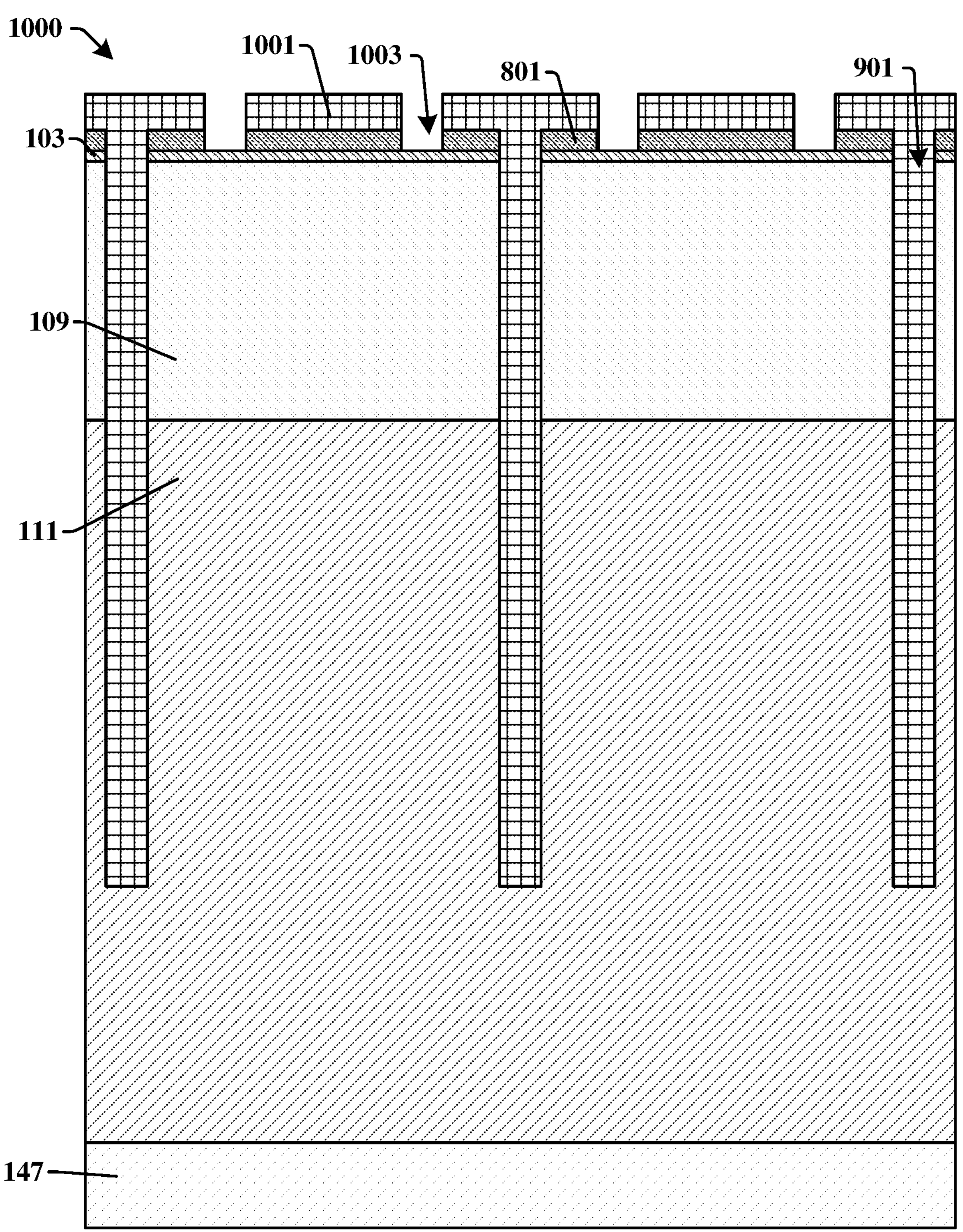
Figure 11:
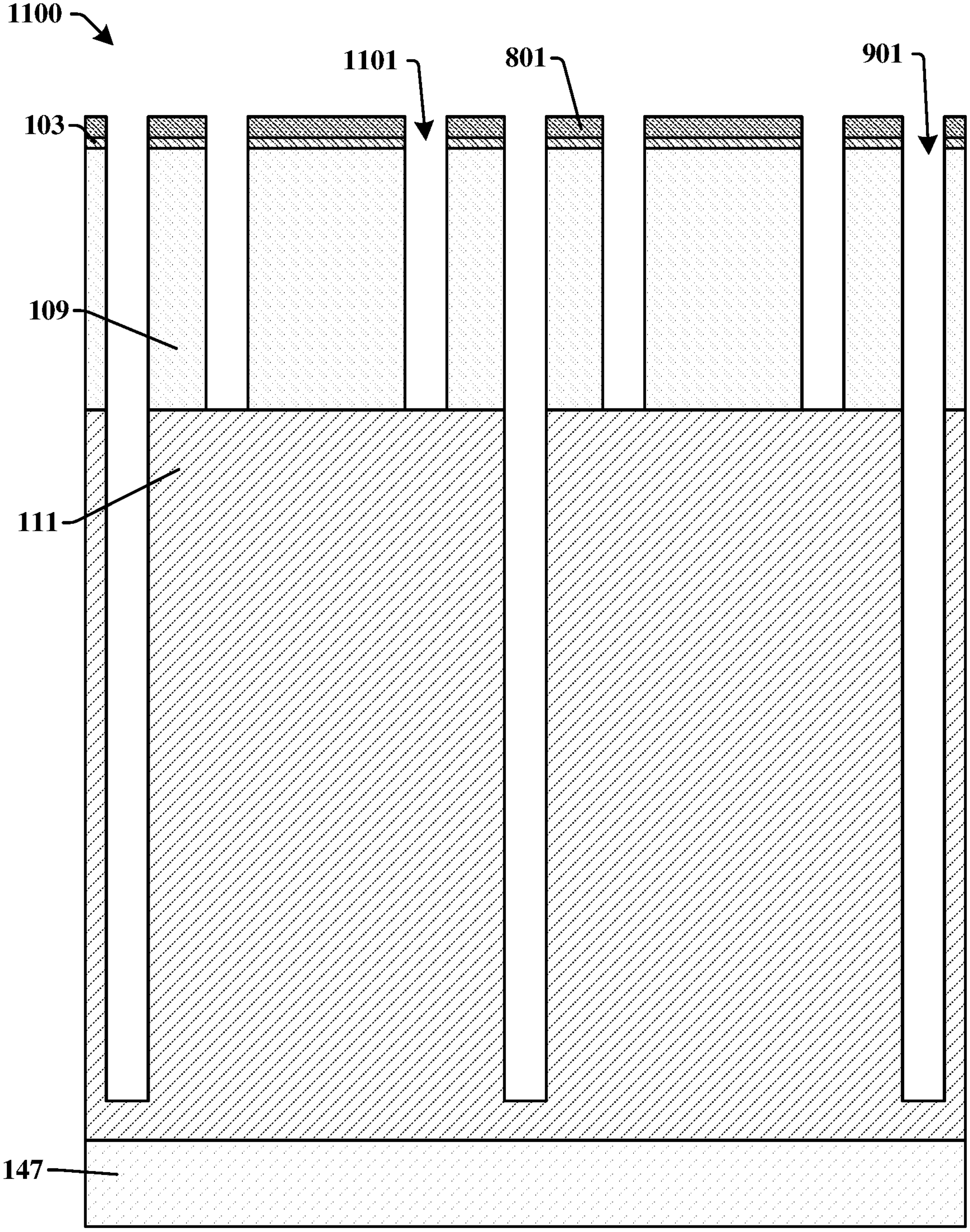

As shown by cross-sectional view 900 of FIG. 9, the hard mask 801 may be used to pattern a grid of trenches 901. As shown by cross-sectional view 1000 of FIG. 10, another photoresist 1001 may be formed and used to etch additional openings 1003 in the hard mask 801. As shown by cross-sectional view 1100 of FIG. 11, the photoresist 1001 may be stripped and the modified hard mask 801 used to etch openings 1101 and to simultaneously deepen the trenches 901. In some embodiments, the final depth of the trenches 901 is in the range from about 500 nm to about 5000 nm. In some embodiments, the final depth of the trenches 901 is in the range from about 1000 nm to about 3000 nm.

Figure 12:
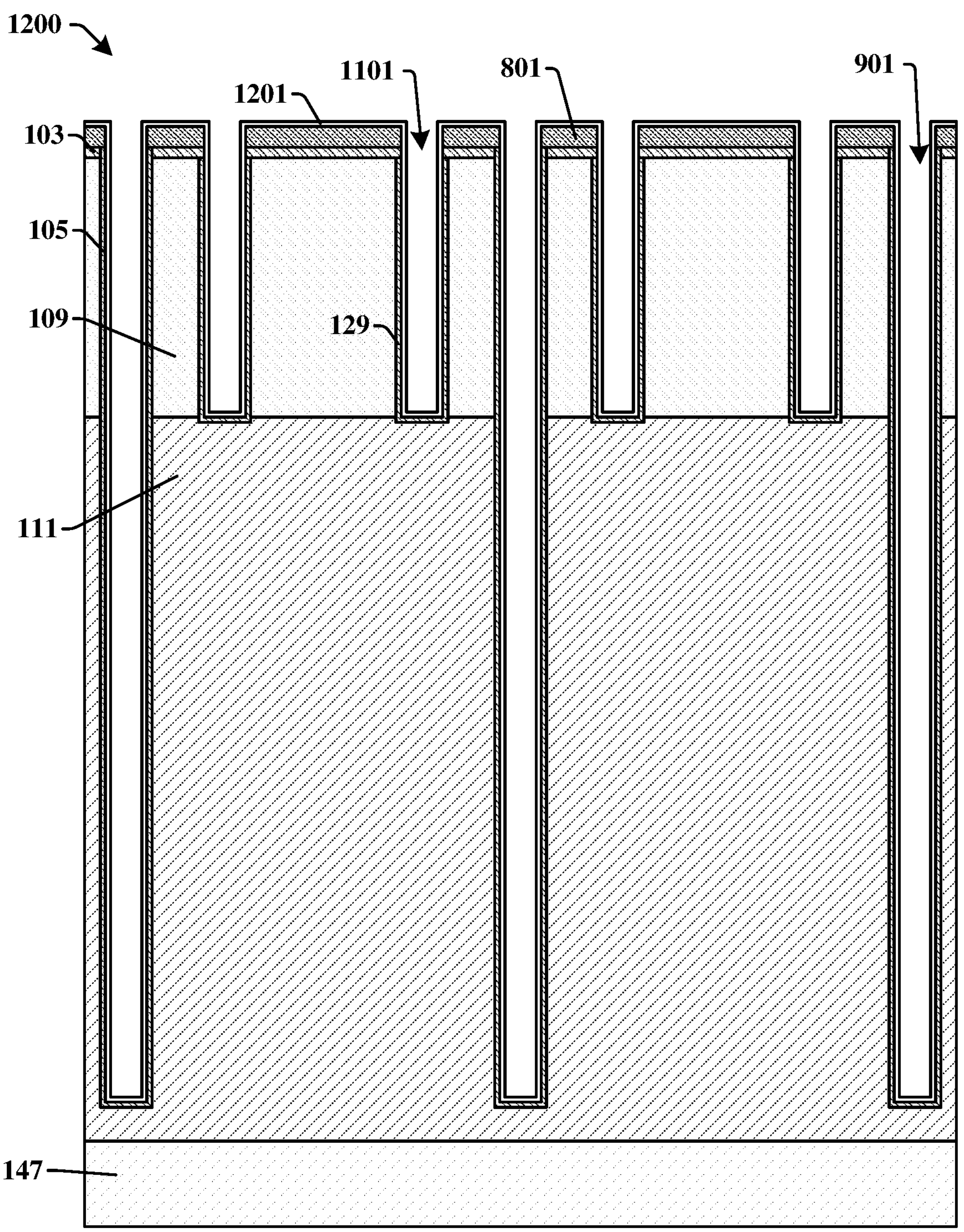

As shown by the cross-sectional view 1200 of FIG. 12, the trenches 901 may be lined with a dielectric 1201 followed by doping to form the P-doped layer 105 in the semiconductor substrate 147 that borders the trenches 901. The P-doped layer 105 may be doped to a higher concentration that the P-doped region 109. In some embodiments, the P-doped layer 105 has a doping concentration in the range from about $10^{15}/cm^3$ to about $10^{21}/cm^3$. The dielectric 1201 may also deposit in the openings 1101 and doping my also form the P-doped layer 129 in the semiconductor substrate 147 that borders the openings 1101. The dielectric 1201 may be an oxide such as silicon oxide (SiO) or the like or any other suitable dielectric or other material that facilitates the doping process. After doping, the dielectric 1201 may be removed as shown by the cross-sectional view 1300 of FIG. 13. The removal process may be a dry etch, a wet etch, or any other suitable process.

Figure 14:
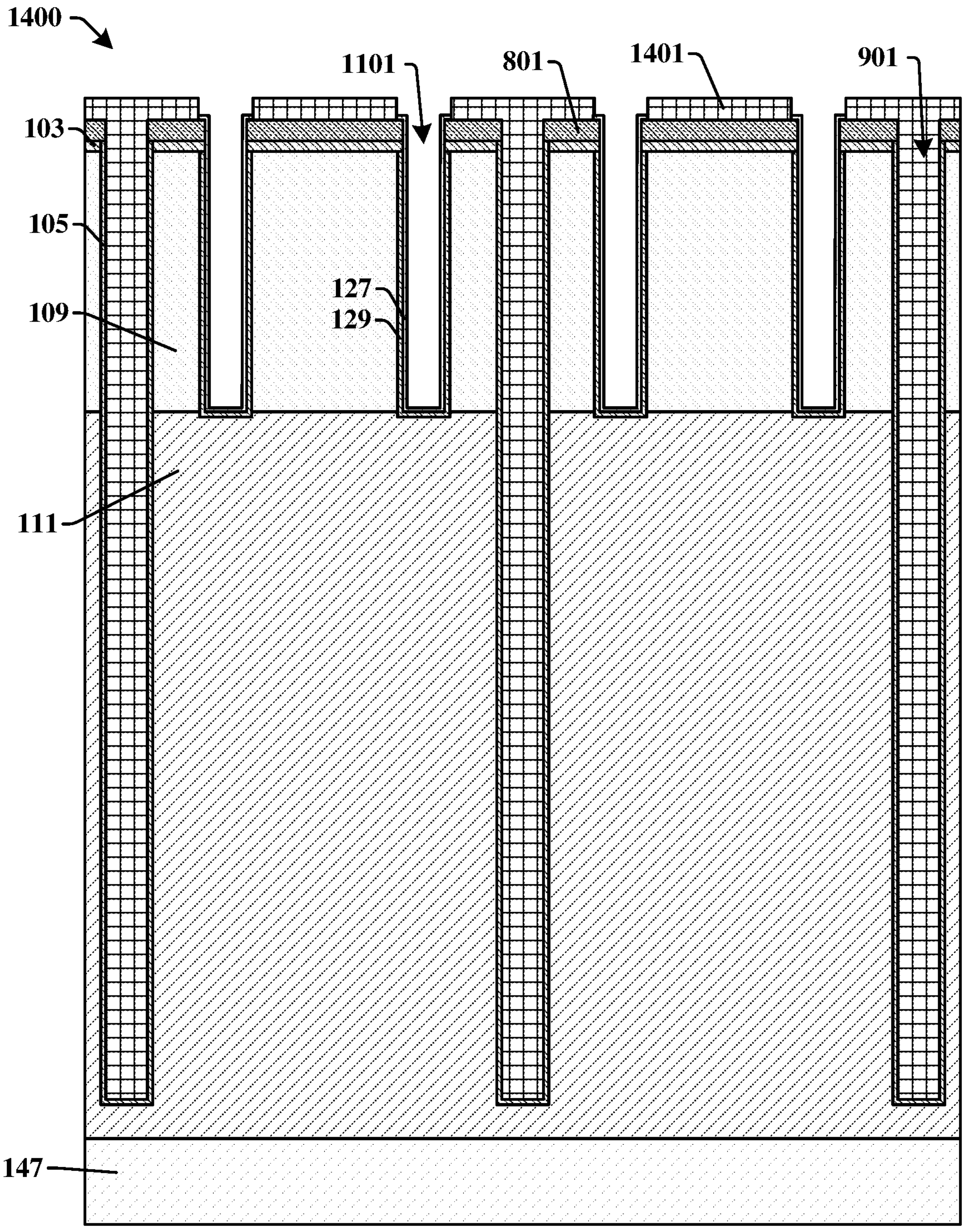

As shown by the cross-sectional view 1400 of FIG. 14, the process may continue with formation of the transfer gate dielectric 127 in the openings 1101. In some embodiments, the transfer gate dielectric 127 is an oxide of the semiconductor substrate 147 and is formed by an oxidation process. In some embodiments, the transfer gate dielectric 127 is formed by deposition. In some embodiments, the transfer gate dielectric 127 is silicon oxide (SiO) or the like. In some embodiments, the transfer gate dielectric 127 is a high-K dielectric. The transfer gate dielectric 127 may be deposited by physical vapor deposition (PVD), chemical vapor deposition (CVD), atomic layer deposition (ALD), the like, or any other suitable process. A mask 1401 may be formed to prevent the transfer gate dielectric from forming in the trenches 901.

Figure 15:
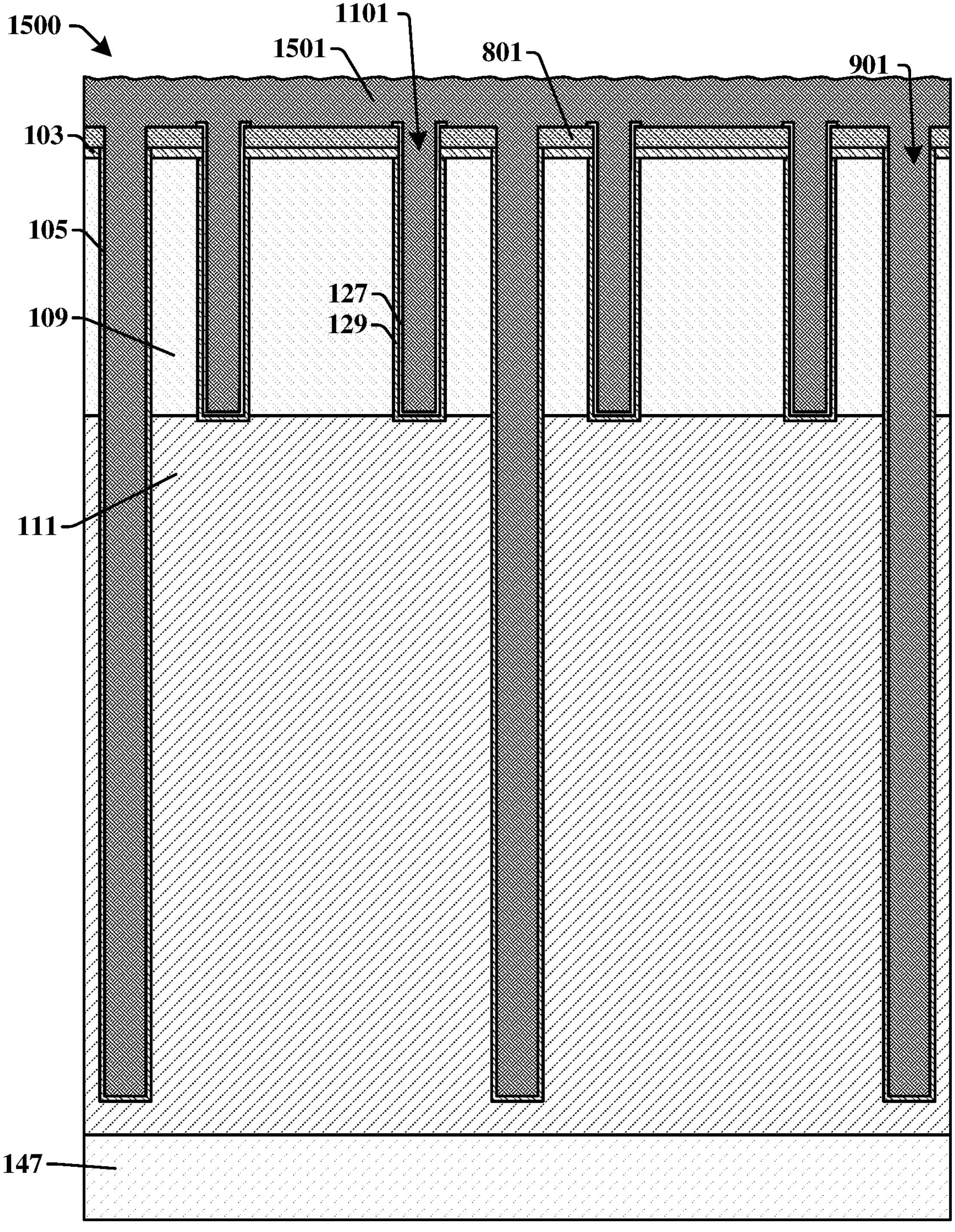

As shown by cross-sectional view 1500 of FIG. 15, a conductive material 1501 may be deposited in such a way as to fill the trenches 901 and the openings 1101. Any suitable conductive material may be used. In some embodiments, the conductive material 1501 is doped polysilicon or the like. In some embodiment, the conductive material 1501 is a metal, a metal compound, or the like. The conductive material 1501 may be deposited by PVD, CVD, ALD, electroless plating, electroplating, the like, or any other suitable process.

Figure 16:
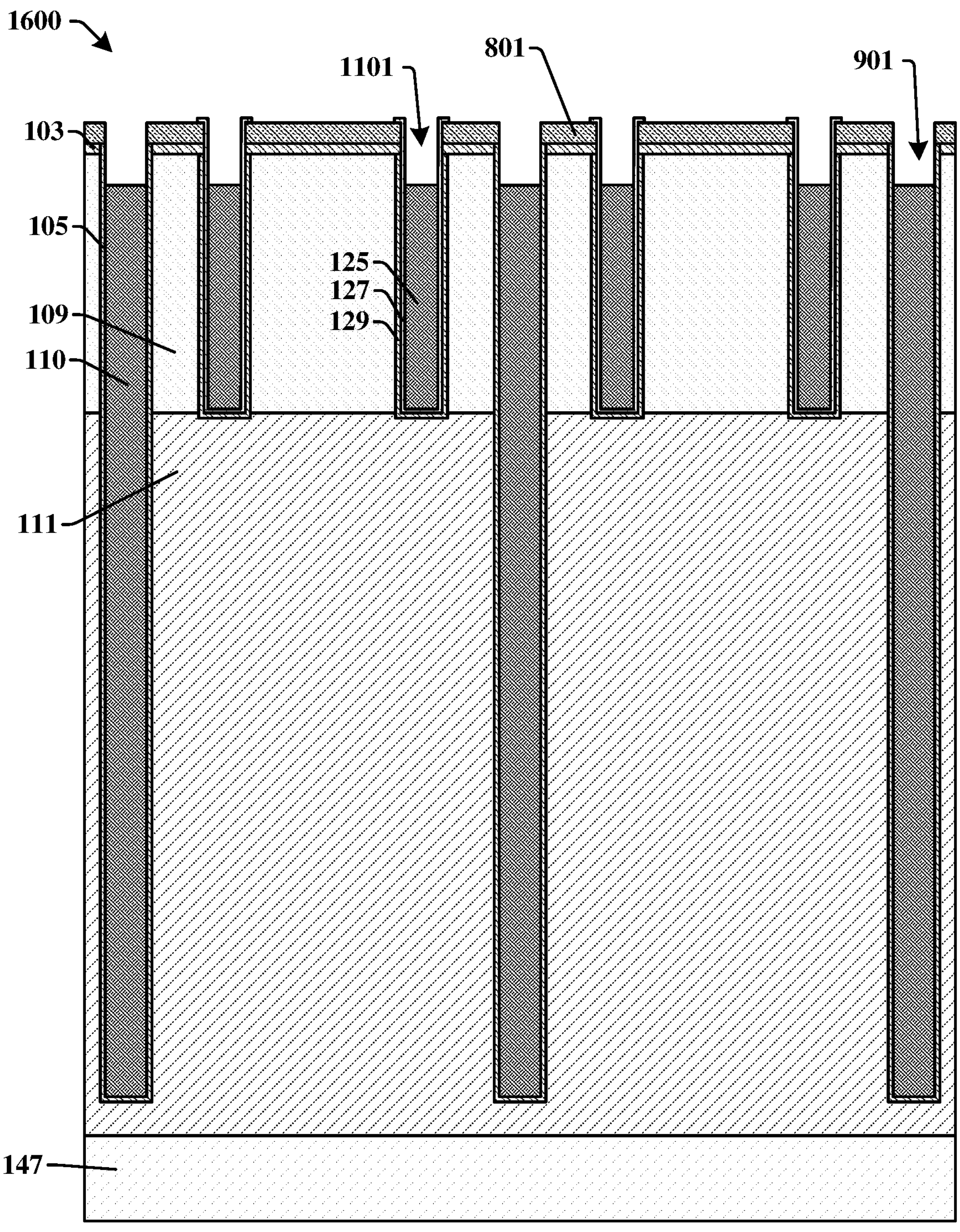

As shown by cross-sectional view 1600 of FIG. 16, a process may be carried out to recess the conductive material 1501 within the openings 1101 and the trenches 901. Any process or combination of processes may be used. In some embodiments, the recessing includes a dry etch process. Recessing is easier when the conductive material 1501 is polysilicon or the like. The conductive material 1501 that remains within the trenches 901 provide the conductive cores 110. The conductive material 1501 that remains within the openings 1101 provides the transfer gate electrodes 125.

Figure 17:
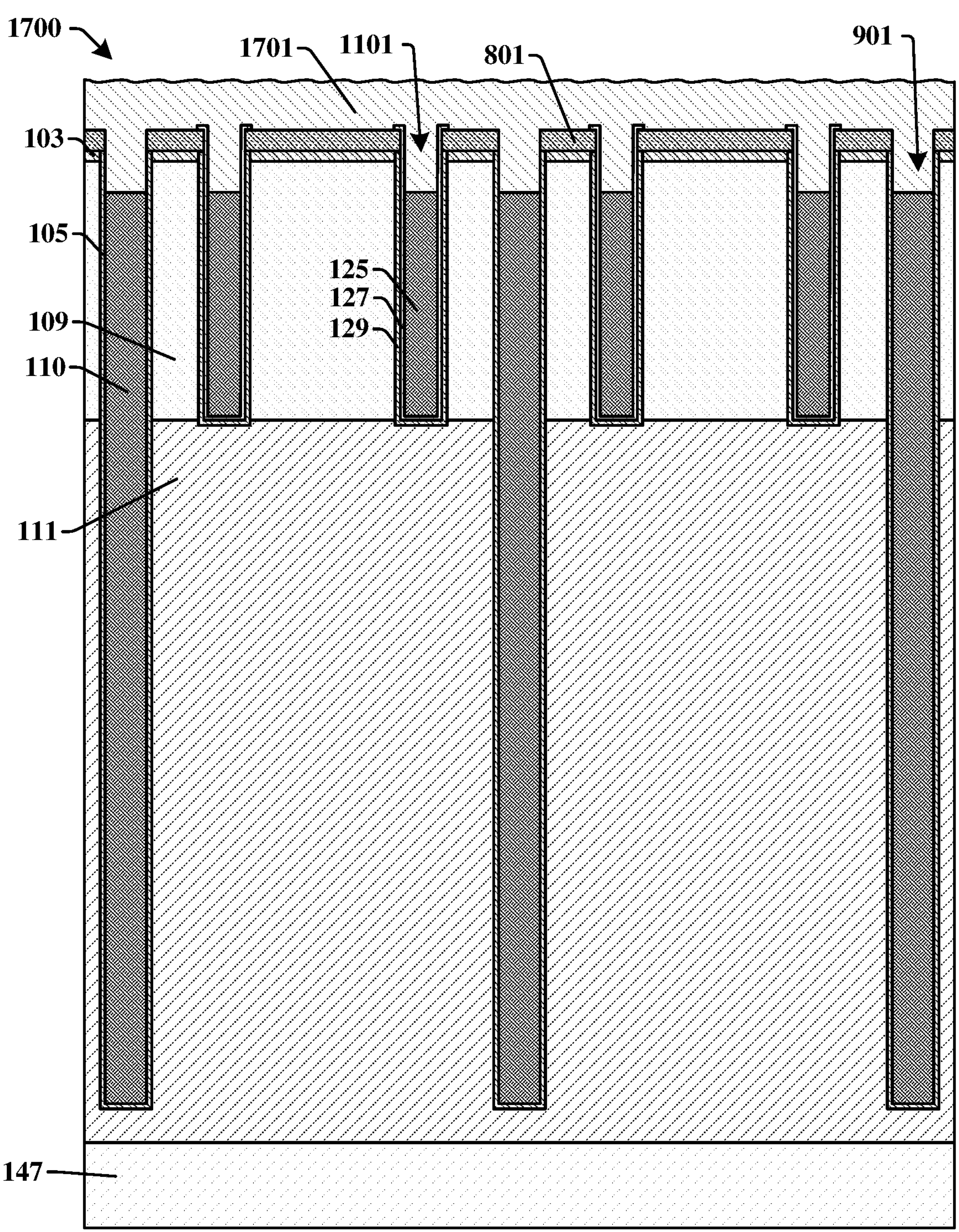

As shown by cross-sectional view 1700 of FIG. 17, a dielectric 1701 may be deposited so as to fill the upper parts of the openings 1101 and the trenches 901 that were exposed by the recessing process. The dielectric 1701 may be silicon oxide (SiO), silicon nitride (SiN), silicon oxynitride (SiON), the like, or any other suitable dielectric. In some embodiments, the dielectric 1701 is silicon dioxide ($SiO_2$). The dielectric 1701 may be deposited by PVD, CVD, ALD, the like, or any other suitable process. In some embodiments, the dielectric 1701 is deposited by a high density plasma CVD process or the like.

Figure 18:
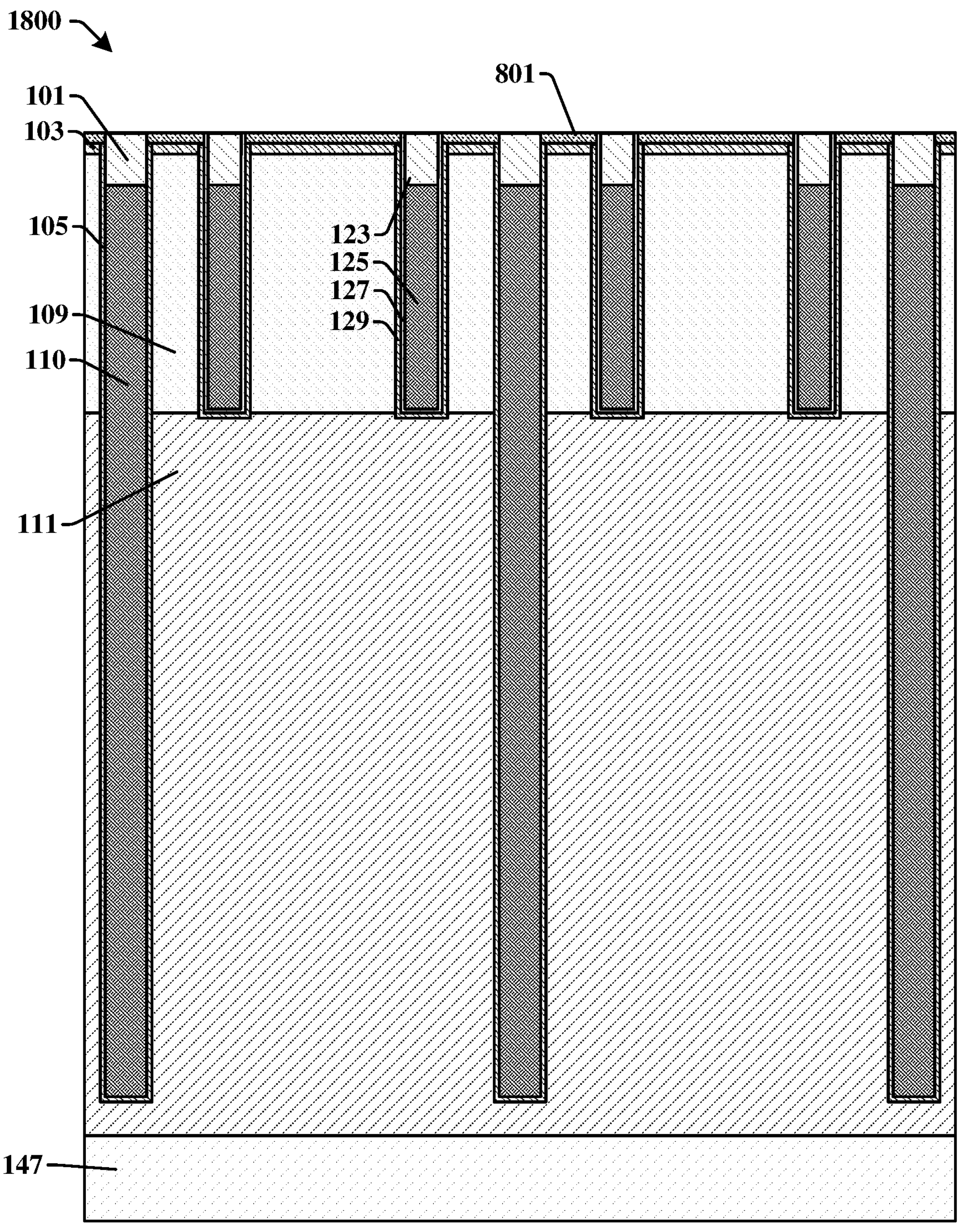

As shown by cross-sectional view 1800 of FIG. 18, an excess portion of the dielectric 1701 may be removed so that a remaining portion of the dielectric 1701 forms the dielectric plugs 101 and the dielectric plugs 123. The removal process may include chemical mechanical polishing (CMP), the like, or any other suitable process.

Figure 19:
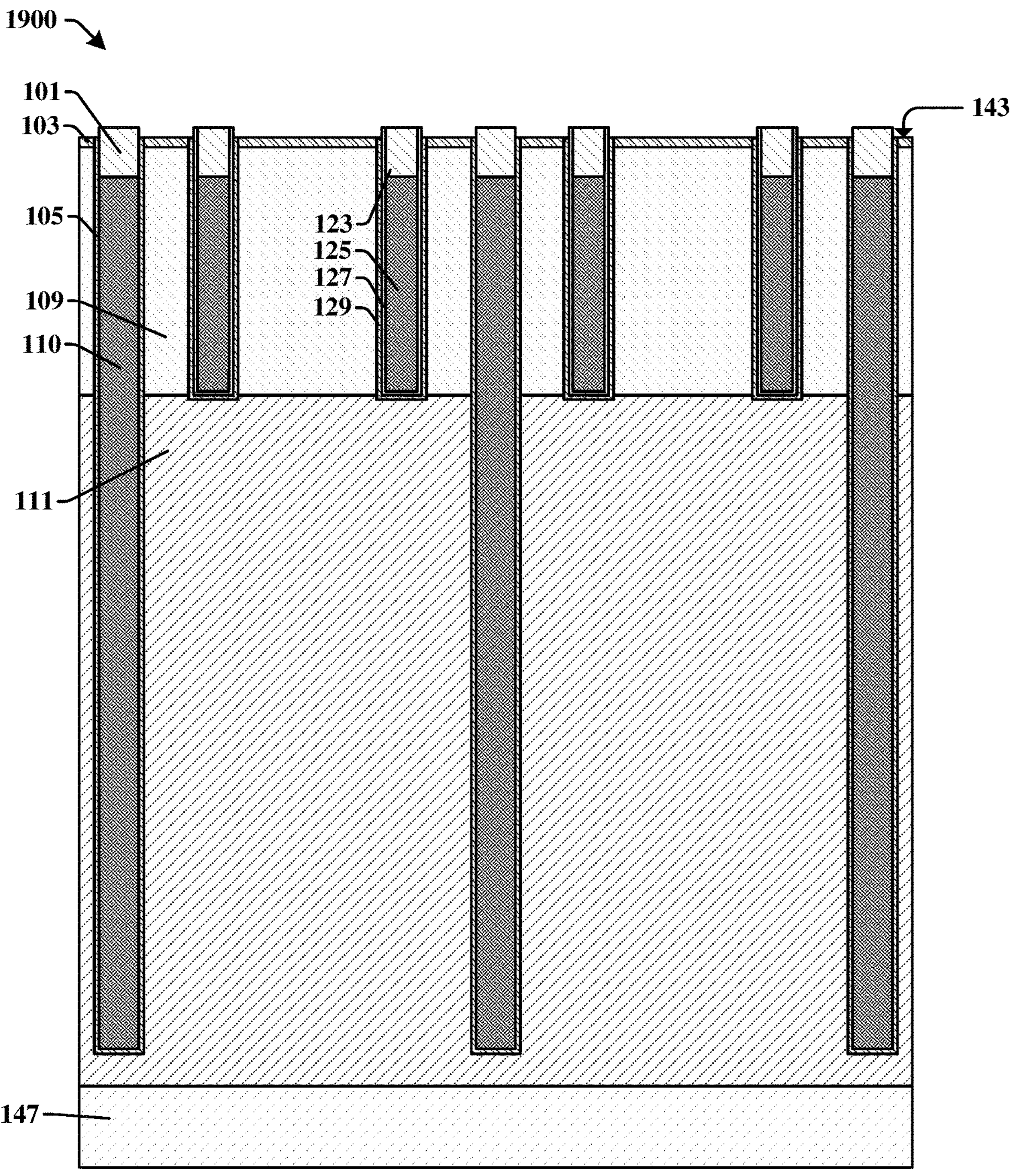

As shown by the cross-sectional view 1900 of FIG. 19, a portion of the hard mask 801 that remains after CMP may be removed. The removal process may be a wet etch, the like, or any other suitable process. In some embodiment, the removal process includes etching with phosphoric acid ($H_3PO_4$). The removal process may leave the tops of the dielectric plugs 101 raised slightly above the front side 143 of the semiconductor substrate 147. In some embodiments, he tops of the dielectric plugs 101 are from about 10 nm to about 200 nm above the front side 143.

Figure 20:
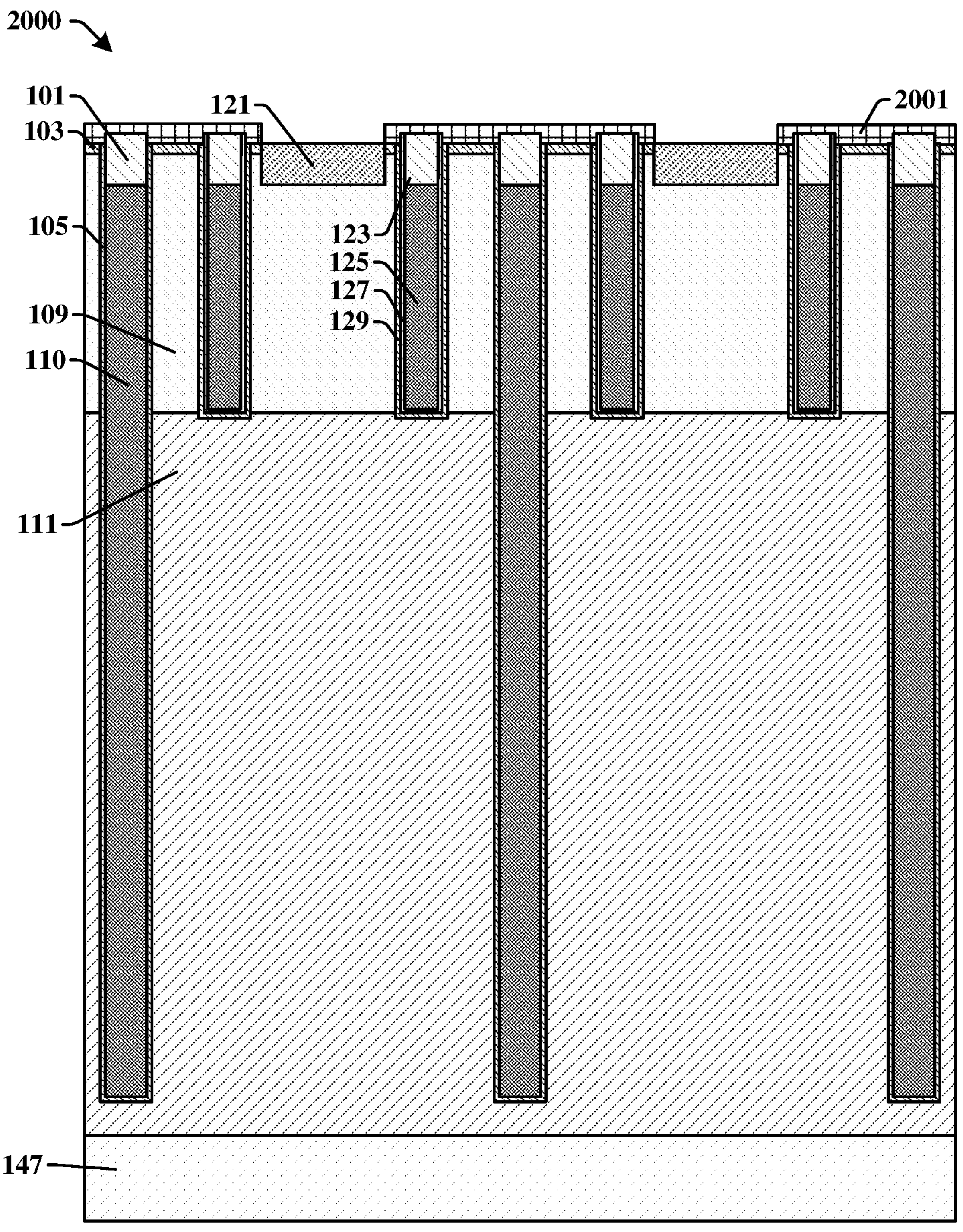

As shown by the cross-sectional view 2000 of FIG. 20, a mask 2001 may be patterned and dopants implanted to form the floating diffusion regions 121. The floating diffusion regions 121 are N-doped. In some embodiments, the doping concentration is in the range from about $10^{13}/cm^3$ to about $10^{18}/cm^3$. In some embodiments, the doping concentration is in the range from about $10^{18}/cm^3$ to about $10^{21}/cm^3$. In some embodiments, source/drain regions for transistors in other areas of the semiconductor substrate 147 may be simultaneously formed. After doping, the mask 2001 may be stripped.

Figure 21:
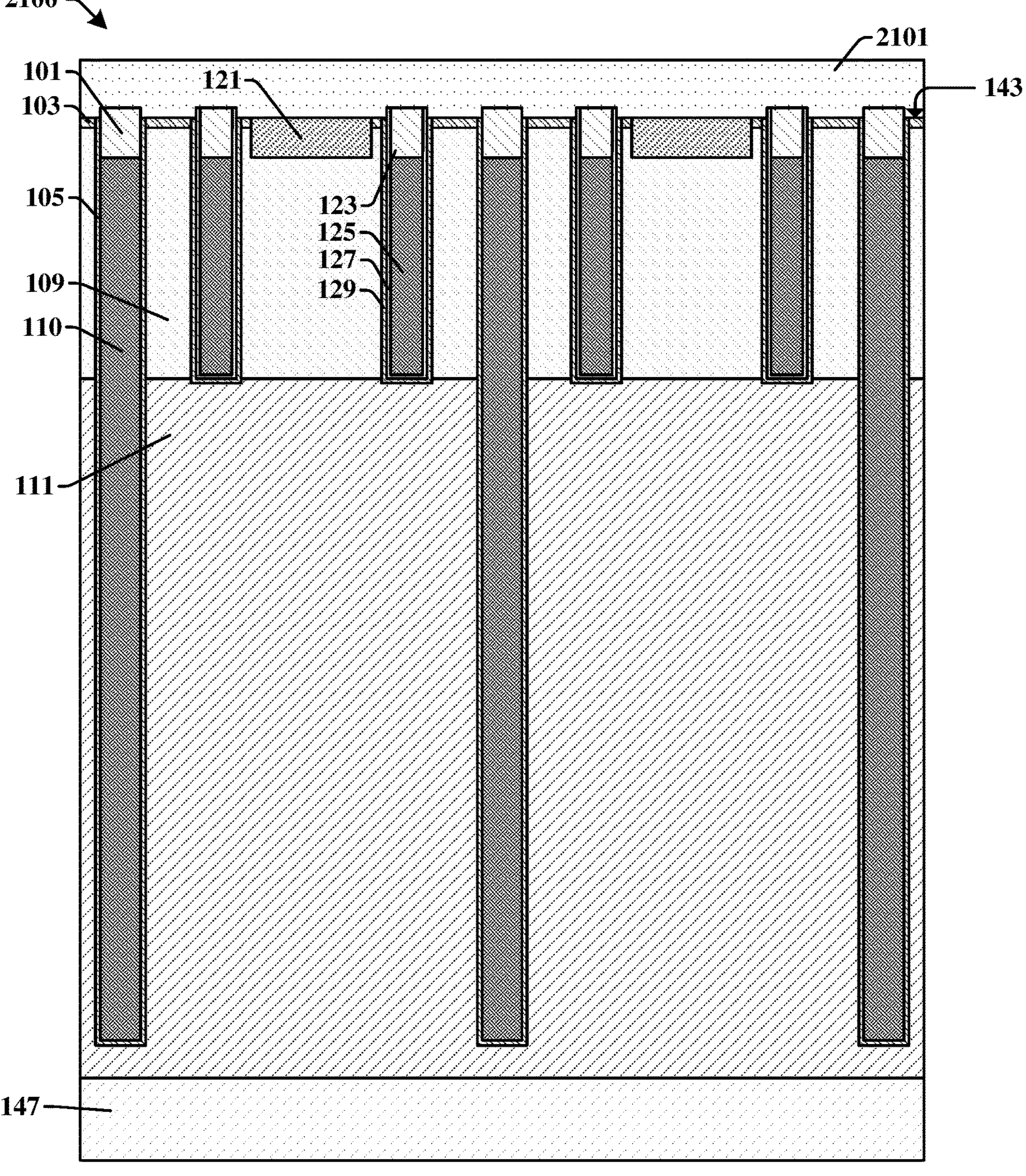

As shown by the cross-sectional view 2100 of FIG. 21, an interlevel dielectric layer 2101 may be formed over the front side 143. The interlevel dielectric layer 2101 may be silicon dioxide ($SiO_2$), a low-k dielectric, or an extremely low-k dielectric. The interlevel dielectric layer 2101 may be formed by, for example, chemical vapor deposition CVD, ALD, or the like. In some embodiments, the ILD layer 2101 is formed by plasma-enhanced CVD (PECVD) using tetraethyl orthosilicate (TEOS).

Figure 22:
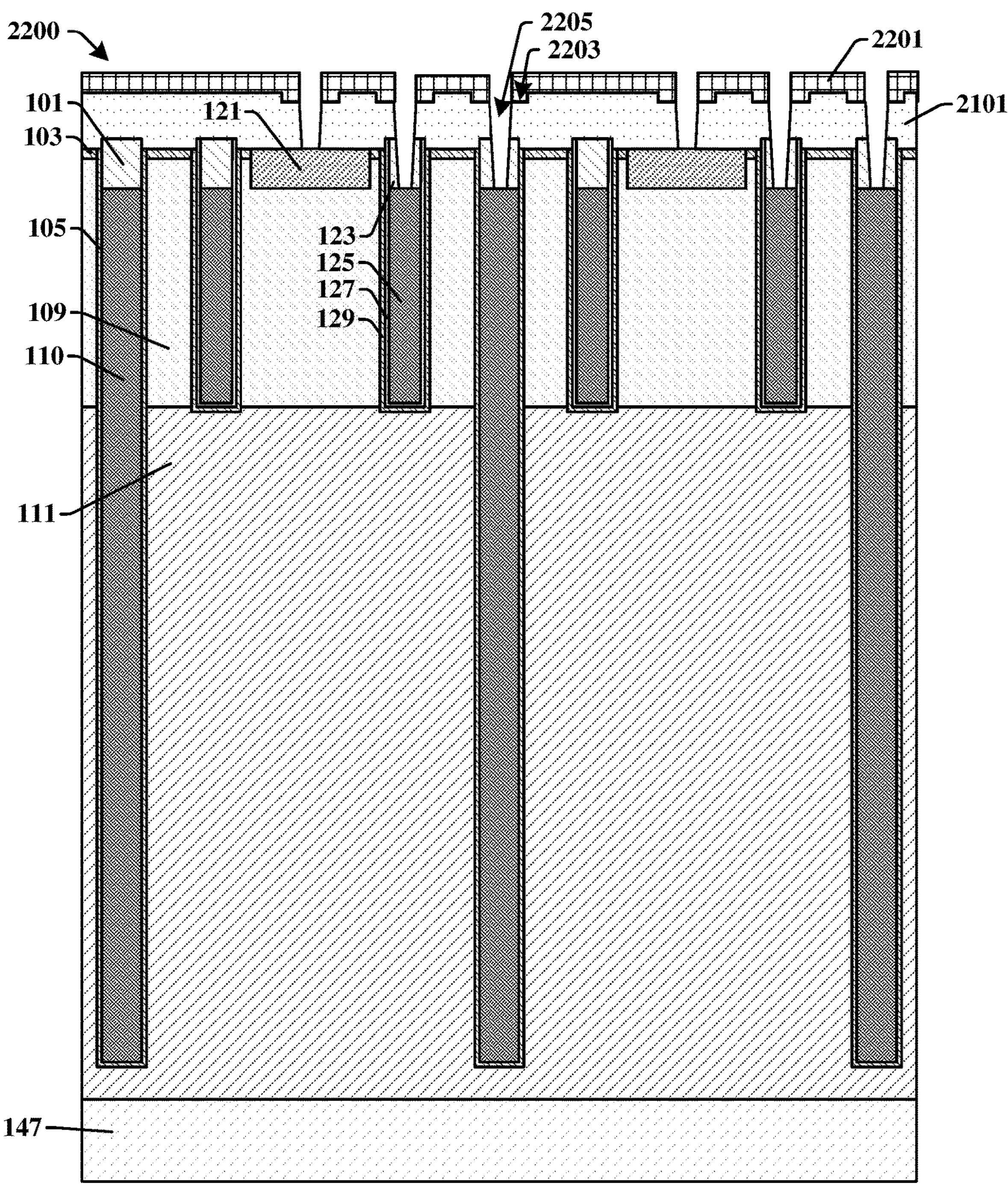

As shown by the cross-sectional view 2200 of FIG. 22, the interlevel dielectric layer 2101 may be patterned in a dual damascene process. The cross-sectional view 2200 shows an intermediate stage after trenches 2203 have been patterned, a second photoresist mask 2201 has been formed, and a second etch process has been carried out to form holes 2205. The dual damascene process may alternately be a via-first dual damascene process or two single damascene processes may be used instead.

Figure 23:
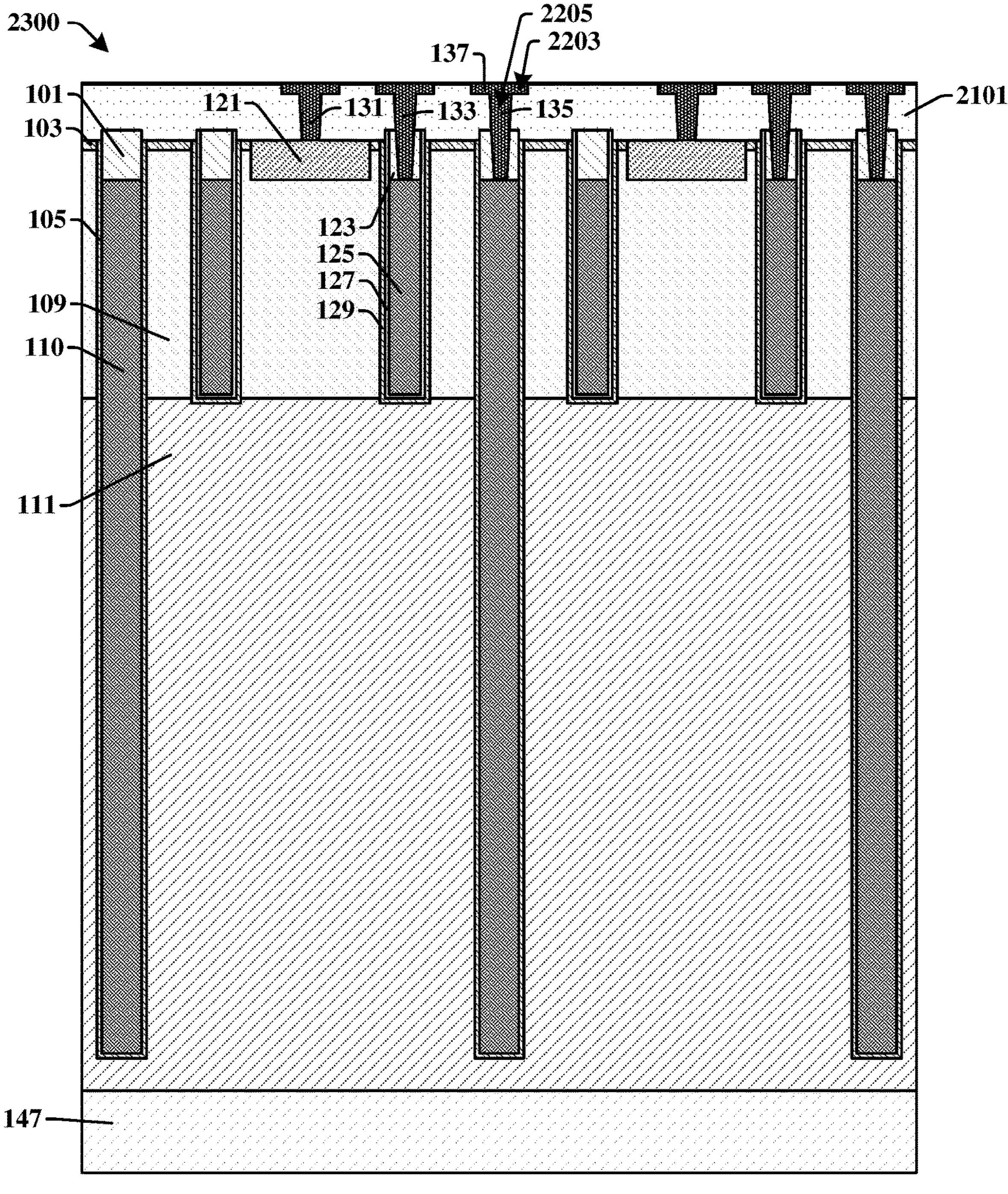

As shown by the cross-sectional view 2300 of FIG. 23, the trenches 2203 and the holes 2205 may be filled with conductive material to form the vias 131, the vias 133, the vias 135, and the M1 metallization layer including the wire 137. The conductive material may be deposited by PVD, CVD, ALD, electroplating, electroless plating, the like, or any other suitable process. Excess conductive material may be removed by a planarization process such as CMP or the like. Any suitable conductive material may be used. In some embodiments, the conductive material is a metal.

Figure 24:
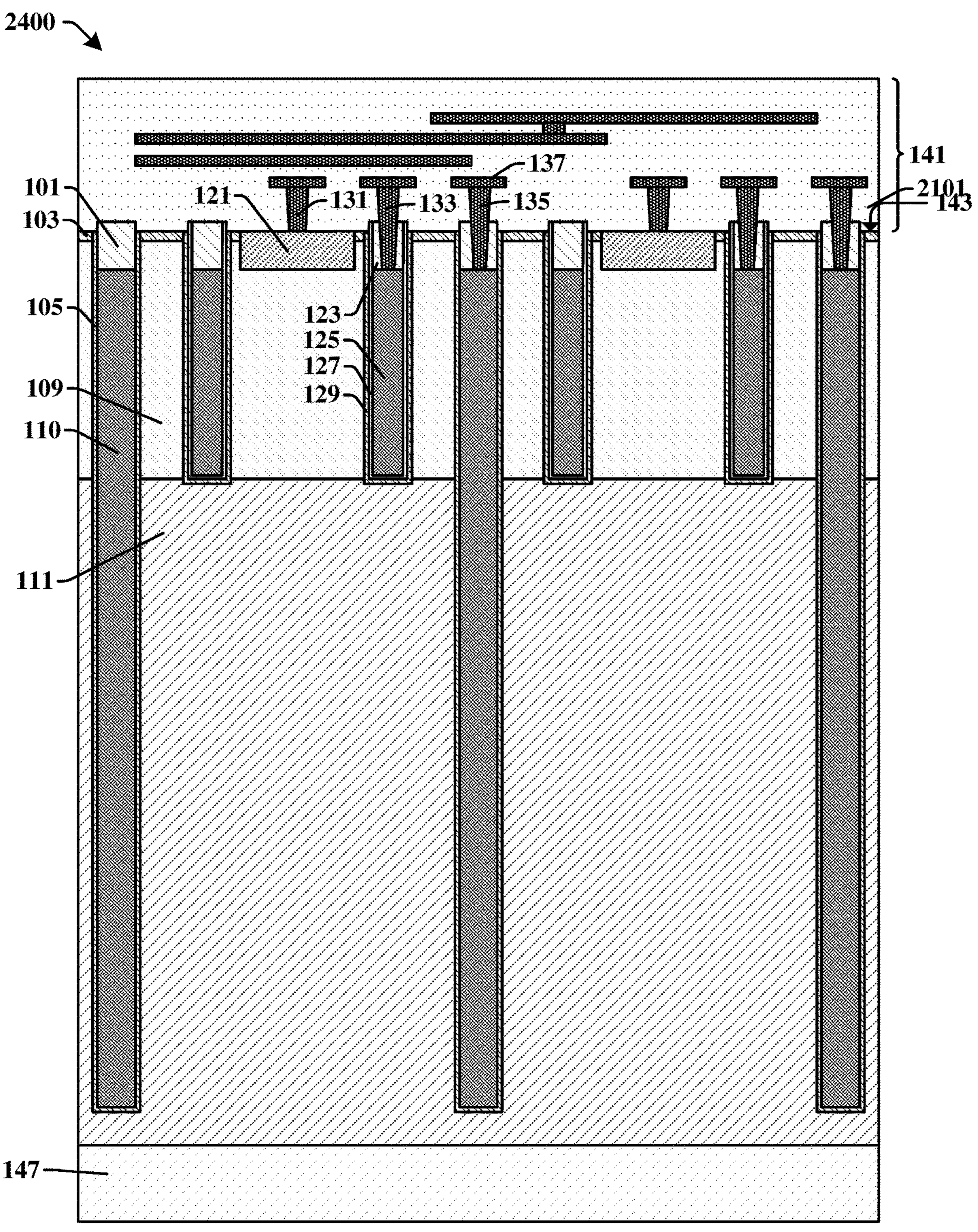

As shown by the cross-sectional view 2400 of FIG. 24, additional via layers and metallization layers may be formed to complete the formation of the metal interconnect 141. The device may be bonded to a second substrate (not shown) through the metal interconnect 141 followed by thinning of the semiconductor substrate 147. The second substrate may provide structural integrity during and after the thinning process. In some embodiments, the semiconductor substrate 147 is thinned to within a range from about 1 μm to about 5 μm. In some embodiments, the semiconductor substrate 147 is thinned to within the range from about 2 μm to about 4 μm.

Additional processing may then take place to form structures on the back side 149 to provide the IC device 100 of FIG. 1 or the like. The additional processing may include depositing the isolation layer 167, depositing a composite grid stack, etching to define the composite grid 151 from the composite grid stack, depositing the encapsulation layer 165, forming the color filters 163, and forming the micro-lenses 161.

The isolation layer 167 may include silicon oxide (SiO), the like, or any other suitable dielectric or combination of dielectric(s). The composite grid 151 may include a back side metal grid 169, a dielectric layer 171, and a hard mask layer 173. The back side metal grid 169 may comprise any suitable metal or combination of metals. In some embodiments, the back side metal grid 169 comprises tungsten (W), the like, or some other suitable metal. The dielectric layer 171 may be or comprise silicon oxide (SiO), the like, or any other suitable dielectric. The hard mask layer 173 may be a nitride, a carbide, the like, a combination thereof, or any other suitable hard mask material. These layers may be deposited by a combination of CVD, PVD, electroplating, electroless plating, the like, or any other suitable processes. The encapsulation layer 165 may be an oxide, the like, or some other suitable dielectric. The color filters 163 and the micro-lenses 161 may have any suitable composition and may be formed by any suitable processes.

Figure 25:
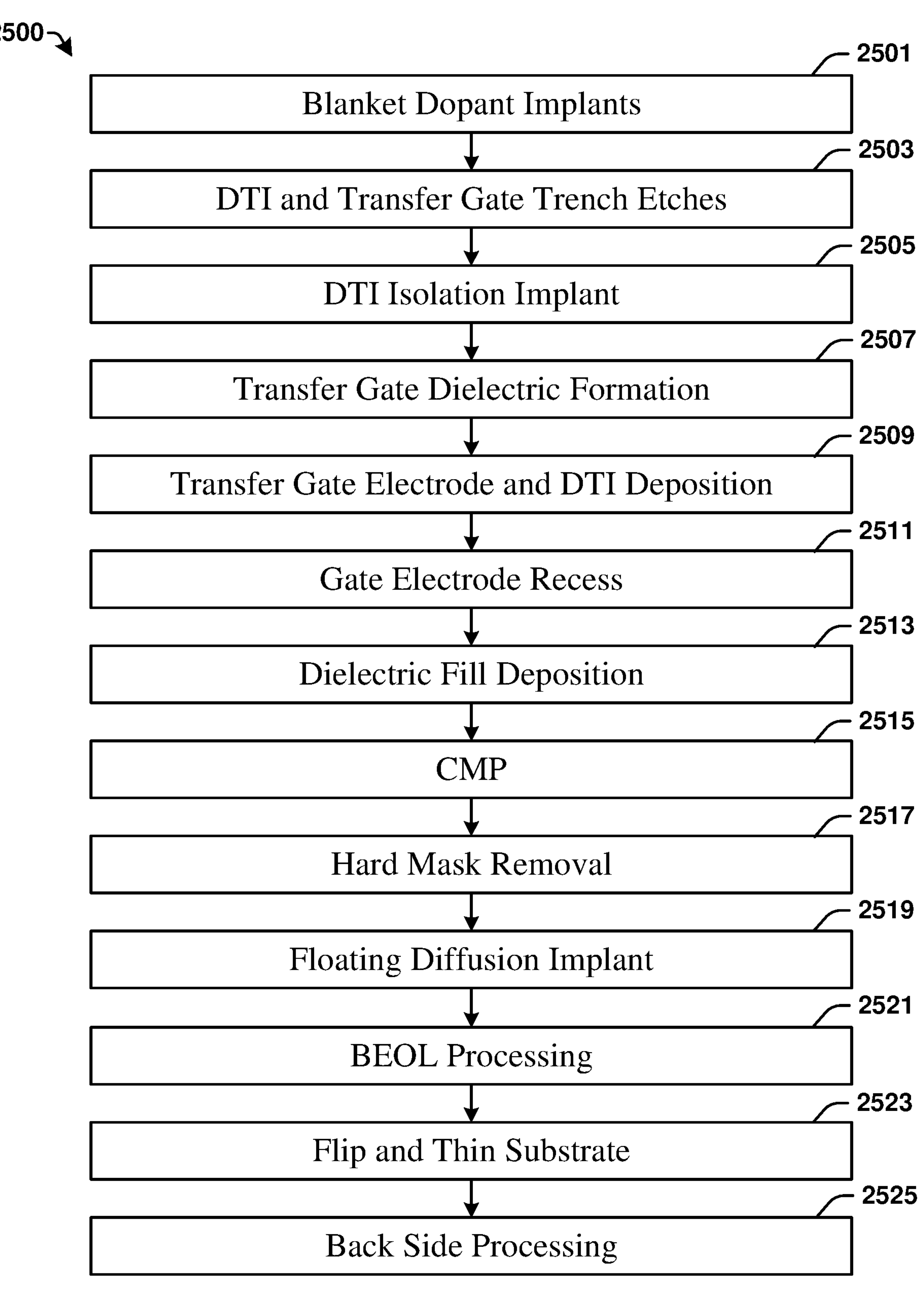
FIG. 25 provides a flow chart illustrating a method according to some embodiments of forming an IC device having a photodetector pixel array according to the present disclosure.

FIG. 25 presents a flow chart for a process 2500 that may be used to form an IC device with an array of photodetector pixels according to the present disclosure. While the process 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 2500 begins with act 2501, a series of blanket dopant implants that form at least the PN diode layers for a photodetector pixel array. The cross-sectional view 700 of FIG. 7 provides an example.

The process 2500 continues with act 2503, etching the substrate to form a grid of trenches for isolating the photodetector pixels and to form openings for transfer gates electrodes according to the present disclosure. In accordance with some embodiments, the formation of these trenches and these openings are combined. The cross-sectional views 800-1100 of FIGS. 8-11 provide an example.

Figure 13:
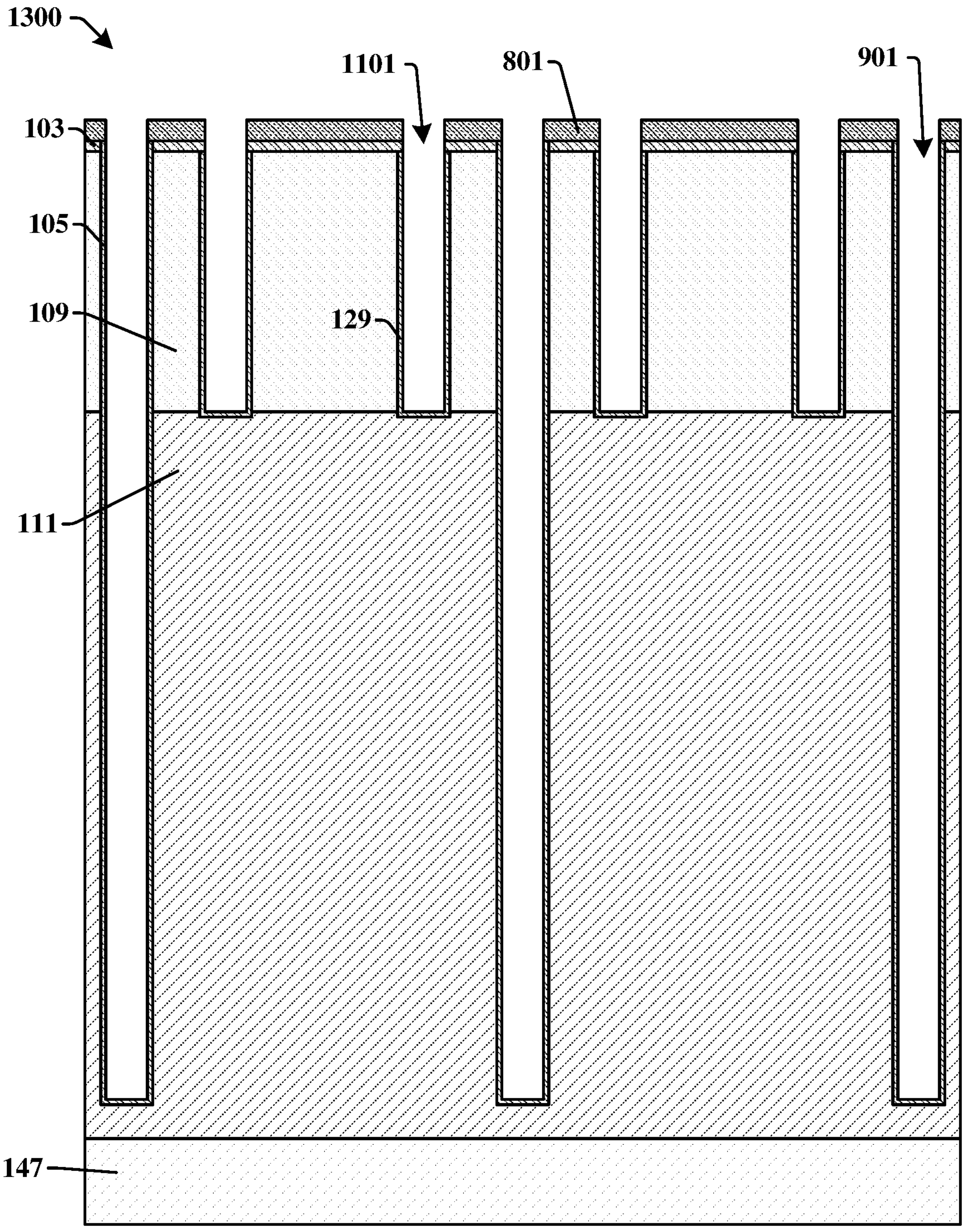

Act 2505 is a dopant implantation process that produces a P-doped layer around the trenches to provide electrical isolation. This may include depositing a liner layer that reduces substrate damage during the doping process. After the doping process, the liner layer may be removed. The cross-sectional views 1200-1300 of FIGS. 12-13 provide an example. The P-doped layer may also be formed around the openings for the transfer gates.

Act 2507 is forming a layer of gate dielectric for the transfer gates. The cross-sectional view 1400 of FIG. 14 provides an example. A mask may be used to prevent this layer from forming in the trenches.

Act 2509 is depositing a conductive material to fill the trenches and holes. The conductive material depositing in the trenches provides a conductive core for a deep trench isolation (DTI) structure. The conductive material depositing in the holes provides transfer gate electrodes. The cross-sectional view 1500 of FIG. 15 provides an example.

Act 2511 is recessing the transfer gate electrodes below the surface of the semiconductor substrate. The process includes an etch and may also recess the conductive core of the DTI structure. The cross-sectional view 1600 of FIG. 16 provides an example.

Act 2513 is depositing dielectric to fill the area of the semiconductor substrate that was voided by the recessing process of act 2511. The cross-sectional view 1700 of FIG. 17 provides an example.

Act 2515 is CMP or another process that removes an excess portion of the dielectric deposited by act 2513. The CMP process may remove a layer of the hard mask used for act 2503. The cross-sectional view 1800 of FIG. 18 provides an example.

Act 2517 is removing any remaining portion of the hard mask. In some embodiments, this is a wet etch. In some embodiments, this process leaves some of the dielectric deposited in act 2513 protruding above the surface of the semiconductor substrate. The cross-sectional view 1900 of FIG. 19 provides an example.

Act 2519 is a dopant implantation process that forms the floating diffusion regions. The cross-sectional view 2000 of FIG. 20 provides an example. This doping may also provide transistor source/drain implants.

Act 2521 is back-end-of-line (BEOL) that produces a metal interconnect on the front side. The cross-sectional views 2100-2400 of FIGS. 21-24 provide an example.

Act 2523 is flipping and thinning the semiconductor substrate. Act 2525 is processing that takes place on the back side of the semiconductor substrate. This may include forming a back side metal grid, color filters, and micro-lens. FIG. 1 provides an example of the resulting structure. In some embodiments, an isolation structure for the photodetector pixels is formed during this stage of processing.

Some aspects of the present teachings relate to an IC device that includes a semiconductor substrate and a photodetector pixel comprising a photodiode, a transfer gate electrode, and a floating diffusion region. The photodiode and the floating diffusion region are in the semiconductor substrate. The transfer gate electrode is confined below a surface of the semiconductor substrate. In some embodiments a top of the transfer gate electrode is at or below a top of the floating diffusion region. In some embodiments the transfer gate electrode is curved with a concave side facing an area of the floating diffusion region. In some embodiments the transfer gate electrode wraps around an area of the floating diffusion region. In some embodiments an isolation structure surrounding the photodetector pixel and a via couples the isolation structure to a metal interconnect above the semiconductor substrate. In some embodiments there is at least one of those vias for every four photodetector pixels. In some embodiments there is one of those vias for each photodetector pixel. In some embodiments the isolation structure has a conductive core with an upper surface that is vertically aligned with an upper surface of the transfer gate electrode. In some embodiments there is a plug of dielectric between the transfer gate electrode and a front side of the semiconductor substrate. In some embodiments there is a similar plug of dielectric between the conductive core and the front side. In some embodiments the transfer gate electrode and the conductive core have the same composition. In some embodiments, a channel region of the transfer gate has a more heavily P-doped layer immediately adjacent the transfer gate dielectric.

Some aspects of the present teachings relate to an IC device that includes a semiconductor substrate and a photodetector pixel comprising a photodiode, a transfer gate, and a floating diffusion region. The photodiode and the floating diffusion region are in the semiconductor substrate. The transfer gate comprises an electrode that wraps at least part way around an area of the floating diffusion region. In some embodiments the electrode clamps two opposite sides the floating diffusion region. In some embodiments the electrode is a monolithic structure. In some embodiments the electrode is embedded within the semiconductor substrate.

Some aspects of the present teachings relate to a method that includes providing a semiconductor substrate having a front side and a back side, forming an n-doped region in the semiconductor substrate, forming a p-doped region above the n-doped region so that the n-doped region and the p-doped region form a PN junction, etching an opening in the front side, lining the opening with a gate dielectric, depositing a conductive material so as to fill the opening, removing a portion of the conductive material so that the conductive material that deposits inside the opening is separated from any of the conductive material that deposited outside the opening, and doping to form a floating diffusion region. The method forms a photodiode comprising the PN junction. The conductive material in the opening forms a transfer gate electrode for a transfer gate between the photodiode and the floating diffusion region. In some embodiments the transfer gate electrode wraps at least partially around an area of the floating diffusion region. In some embodiments the transfer gate electrode surrounds an area of the floating diffusion region. In some embodiments the method further includes etching trenches in the semiconductor substrate and depositing conductive material deposits the conductive material in the trenches. The conductive material in the trenches forms part of an isolation structure around the photodiode. In some embodiments, the method further includes etching to recess the conductive material within the opening and depositing dielectric to fill the opening above the transfer gate electrode. In some embodiments, the method further includes forming an isolation structure around the photodiode, forming a dielectric layer over the front side, and forming vias through the dielectric layer. The vias variously couple with the transfer gate electrode, the floating diffusion region, and the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

providing a semiconductor substrate having a front side and a back side;

forming an n-doped region in the semiconductor substrate;

forming a p-doped region above the n-doped region so that the n-doped region and the p-doped region form a PN junction;

etching trenches and an opening in the front side;

lining the opening with a gate dielectric;

depositing a conductive material so as to simultaneously fill the opening and the trenches;

removing a portion of the conductive material so that the conductive material that deposits inside the opening is separated from any of the conductive material that deposited outside the opening; and performing a first dopant implantation process that implant a first dopant into the semiconductor substrate, wherein the first dopant implantation process forms a floating diffusion region in the semiconductor substrate;

wherein the method forms a photodiode comprising the PN junction;

the conductive material in the opening forms a transfer gate electrode for a transfer gate between the n-doped region and the floating diffusion region; and the conductive material in the trenches forms part of an isolation structure around the photodiode.

2. The method of claim 1, wherein the transfer gate electrode wraps partially around an area of the floating diffusion region.

3. The method of claim 1, wherein the first dopant implantation process implants the first dopant into the semiconductor substrate only up to a first depth, and the method further comprises:

etching to recess the transfer gate electrode within the opening, wherein etching recesses the transfer gate below the first depth; and depositing dielectric to fill the opening above the transfer gate electrode.

4. The method of claim 1, further comprising:

forming an isolation structure around the photodiode;

forming a dielectric layer over the front side; and forming vias through the dielectric layer, wherein the vias couple with the transfer gate electrode, the floating diffusion region, and the isolation structure.

5. The method of claim 1, further comprising performing a second dopant implantation process that transports a second dopant into the trenches and the opening and from those locations into the semiconductor substrate along sidewalls of the trenches and the opening.

6. The method of claim 1, wherein etching the trenches in the front side comprises an etch process that forms the opening in the front side.

7. A method, comprising:

receiving a semiconductor substrate having a first side, a second side, and a pixel area;

implanting dopants through the first side to form an n-doped region;

implanting dopants through the first side to form a p-doped region above the n-doped region, wherein the n-doped region and the p-doped region form a PN junction in the pixel area;

etching an opening in the first side in the pixel area;

lining the opening with a gate dielectric;

depositing a conductive material, wherein the conductive material fills the opening to form a transfer gate electrode, and the transfer gate electrode is confined to a depth that is at or above the PN junction;

removing excess conductive material whereby the transfer gate electrode is confined at or below a surface of the semiconductor substrate;

implanting a dopant into the semiconductor substrate using a first dopant implantation process to form a floating diffusion region laterally adjacent the transfer gate in the pixel area;

forming a dielectric layer over the first side;

forming vias through the dielectric layer, wherein the vias include a via that contacts the transfer gate electrode and a via that contacts the floating diffusion region;

thinning the semiconductor substrate from the second side; and forming a microlens on the second side opposite the transfer gate.

8. The method of claim 7, wherein removing excess conductive material comprises etching of the conductive material that recesses the transfer gate electrode into the semiconductor substrate.

9. The method of claim 7, wherein:

the first dopant implantation process implants an N-type dopant to a first depth, which is a depth of the floating diffusion region; and the removing of excess conductive material continues until the conductive material is recessed to the first depth or lower.

10. The method of claim 7, further comprising:

forming a hard mask over the first side prior to forming the conductive plug; and removing the hard mask after forming the conductive plug, whereby the conductive plug protrudes above the first side.

11. The method of claim 7, wherein the via that contacts the transfer gate electrode is longer than the via that contacts the floating diffusion region.

12. The method of claim 7, further comprising forming a trench in the semiconductor substrate around the pixel area, wherein the trench has sidewalls and depositing the conductive material to fill the opening simultaneously deposits the conductive material in the trench.

13. The method of claim 12, further comprising performing a second dopant implantation process that implants P-type dopants via the trench into the semiconductor substrate along the sidewalls of the trench.

14. The method of claim 13, wherein the second dopant implantation process implant the P-type dopants via the opening into the semiconductor substrate along sidewalls of the opening.

15. The method of claim 7, wherein the transfer gate electrode is curved with a concave side facing an area of the floating diffusion region.

16. The method of claim 7, wherein the transfer gate electrode wraps around an area of the floating diffusion region.

17. A method, comprising:

receiving a semiconductor substrate having a first side, a second side, and a pixel area;

implanting dopants through the first side to form an n-doped region;

implanting dopants through the first side to form a p-doped region above the n-doped region, wherein the n-doped region and the p-doped region form a PN junction in the pixel area;

etching a trench in the first side in the pixel area, wherein the trench curves;

lining the trench with a gate dielectric;

depositing a conductive material, wherein the conductive material fills the trench to form a transfer gate electrode, wherein the transfer gate electrode curves without forming a closed loop so as to define a concavity;

implanting dopants to form a floating diffusion region, wherein the floating diffusion region is at least partially within the concavity;

forming a dielectric layer over the first side;

forming vias through the dielectric layer, wherein the vias include a via that contacts the transfer gate electrode and a via that contacts the floating diffusion region;

thinning the semiconductor substrate from the second side; and forming a microlens on the second side opposite the transfer gate.

18. The method of claim 17, wherein a portion of the floating diffusion region is outside the concavity.

19. The method of claim 17, wherein the via that contacts the floating diffusion region contacts the portion of the floating diffusion region that is outside the concavity.

20. The method of claim 19, wherein the via that contacts the floating diffusion region contacts three other floating diffusion regions.

* * * * *